US012812950B2

(12) United States Patent
Grote et al.

(10) Patent No.: US 12,812,950 B2
(45) **Date of Patent: *Nov. 24, 2026**

(54) SEMICONDUCTOR DEVICE WITH MULTI-STEP GATE AND RECESSED MULTI-STEP FIELD PLATE AND METHOD OF FABRICATION THEREFOR

(71) Applicant: NXP USA, Inc., Austin, TX (US)

(72) Inventors: Bernhard Grote, Phoenix, AZ (US); Bruce McRae Green, Gilbert, AZ (US)

(73) Assignee: NXP USA, INC., Austin, TX (US)

(*) Notice: Subject to any disclaimer, the term of this patent is extended or adjusted under 35 U.S.C. 154(b) by 329 days.

This patent is subject to a terminal disclaimer.

(21) Appl. No.: 18/499,088

(22) Filed: Oct. 31, 2023

(65) Prior Publication Data

US 2025/0142923 A1 May 1, 2025

(51) Int. Cl.

| | |
|---|---|
| ***H10D 64/00*** | (2025.01) |
| ***H10D 30/01*** | (2025.01) |
| ***H10D 30/47*** | (2025.01) |
| ***H10D 64/01*** | (2025.01) |
| ***H10D 64/23*** | (2025.01) |

(52) U.S. Cl.

CPC ......... *H10D 64/112* (2025.01); *H10D 30/015* (2025.01); *H10D 30/475* (2025.01); *H10D 64/015* (2025.01); *H10D 64/021* (2025.01); *H10D 64/258* (2025.01)

(58) Field of Classification Search

CPC .. H10D 64/112; H10D 64/258; H10D 30/015; H10D 64/021; H10D 64/015; H10D 30/475

See application file for complete search history.

(56) References Cited

U.S. PATENT DOCUMENTS

| | | | |
|---|---|---|---|
| 6,867,078 | B1 | 3/2005 | Green et al. |
| 7,592,211 | B2 | 9/2009 | Sheppard et al. |
| 7,982,265 | B2 | 7/2011 | Challa et al. |
| 8,049,252 | B2 | 11/2011 | Smith et al. |
| 9,673,213 | B1 | 6/2017 | Yu et al. |
| 9,741,840 | B1 | 8/2017 | Moens et al. |

(Continued)

OTHER PUBLICATIONS

U.S. Appl. No. 18/499,100 Non Final Office Action issued on Jan. 13, 2026; 32 pages.

(Continued)

*Primary Examiner* — Richard A Booth
(74) *Attorney, Agent, or Firm* — Sherry W. Gourlay

(57) ABSTRACT

A semiconductor device includes a semiconductor substrate, surface passivation over the semiconductor substrate, and a first interlayer dielectric over the surface passivation. A gate electrode includes a gate channel portion that extends through the surface passivation to contact the upper surface of the semiconductor substrate, a first gate field plate with a first horizontal bottom extent that overlies and contacts the upper surface of the surface passivation, and a second gate field plate with a second horizontal bottom extent that is higher than the first horizontal bottom extent. A conductive field plate includes a first field plate with a third horizontal bottom extent that is recessed below the upper surface of the (Continued)

surface passivation, and a second field plate with a fourth horizontal bottom extent that is higher than the first horizontal bottom extent of the first gate field plate.

23 Claims, 11 Drawing Sheets

(56) References Cited

U.S. PATENT DOCUMENTS

| | | | | |
|---|---|---|---|---|
| 9,847,411 | B2 | 12/2017 | Sriram et al. | |
| 10,319,680 | B1 | 6/2019 | Sel et al. | |
| 11,075,271 | B2 | 7/2021 | Jones et al. | |
| 11,335,784 | B2 * | 5/2022 | Ho | H10D 64/111 |
| 11,532,742 | B2 | 12/2022 | Tailor et al. | |
| 12,040,273 | B2 * | 7/2024 | Huang | H10W 20/098 |
| 2012/0261720 | A1 | 10/2012 | Puglisi et al. | |
| 2012/0313149 | A1 | 12/2012 | Yin et al. | |
| 2013/0280877 | A1 | 10/2013 | Kobayashi et al. | |
| 2015/0194483 | A1 | 7/2015 | Kajitani et al. | |
| 2017/0018617 | A1 | 1/2017 | Xia et al. | |
| 2021/0407947 | A1 | 12/2021 | Chen et al. | |
| 2022/0130985 | A1 * | 4/2022 | Bothe | H10D 30/475 |
| 2022/0302291 | A1 | 9/2022 | Guo et al. | |
| 2022/0359314 | A1 | 11/2022 | Djemour et al. | |
| 2023/0197795 | A1 | 6/2023 | Grote et al. | |
| 2023/0197797 | A1 | 6/2023 | Zhu et al. | |
| 2023/0197839 | A1 | 6/2023 | Zhu et al. | |
| 2023/0207675 | A1 | 6/2023 | Grote et al. | |
| 2023/0369424 | A1 | 11/2023 | You et al. | |
| 2024/0162304 | A1 | 5/2024 | Fisher et al. | |
| 2024/0395872 | A1 | 11/2024 | Hu et al. | |

OTHER PUBLICATIONS

U.S. Appl. No. 18/499,083 Non Final Office Action issued on Jan. 26, 2026, 15 pages.

U.S. Appl. No. 18/147,972, filed Dec. 29, 2022, 122 pages.

DJ Denninghoff et al.: "Design of High-Aspect-Ratio T-Gates on N-Polar GaN/AlGaN MIS-HEMTs for High fmax", IEEE EDL 33 pp. 785-787 (Jun. 2012).

RY El Kashlan et al.: "Analysis of Gate-Metal Resistance in CMOS-Compatible RF GaN HEMTs", IEEE TED 67 pp. 4592-4596 (Nov. 2020).

KM Bothe et al.: "Improved X-Band Performance and Reliability of a GaN HEMT With Sunken Source Connected Field Plate Design" IEEE EDL 43 p. 354 (Mar. 2022).

U.S. Appl. No. 18/499,083, filed Oct. 31, 2023, 75 pages.

U.S. Appl. No. 18/499,100, filed Oct. 31, 2023, 58 pages.

U.S. Appl. No. 18/499,100 Final Office Action issued on Jul. 1, 2026; 36 pages.

U.S. Appl. No. 18/499,083 Final Office Action issued on Jul. 31, 2026, 16 pages.

* cited by examiner

SEMICONDUCTOR DEVICE WITH MULTI-STEP GATE AND RECESSED MULTI-STEP FIELD PLATE AND METHOD OF FABRICATION THEREFOR

TECHNICAL FIELD

Embodiments of the subject matter described herein relate generally to semiconductor devices with gate electrodes and field plates and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications.

Some GaN transistors include a field plate, which is an electrically grounded area of metallization that extends over the transistor's gate electrode. The field plate functions to alter the electric field distribution, particularly at the drain-side gate edge. This may result in an increased breakdown voltage and a reduced high-field trapping effect. Accurate alignment of the gate channel and the field plate is important in achieving the necessary device performance for various RF and power applications. In addition, the gate resistance, $R_G$, of a GaN transistor is an important factor in determining the large signal gain by affecting the input power. However, conventional method of decreasing the gate resistance may result in increased gate-drain capacitance, $C_{GD}$, and increased gate-source capacitance, $C_{GS}$, which may result in a gain reduction or a decrease in the cut-off frequency. Accordingly, in order to meet device performance requirements for a given application, there is a need for GaN devices and methods of fabricating such devices that ensure accurate alignment of the gate channel and the field plate, and relatively low gate resistance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments disclosed herein include field effect transistors (FETs), and in particular heterojunction field effect transistors (HFET) including high electron mobility transistors (HEMTs). The transistor embodiments each include a gate electrode and a field plate structure. According to one or more embodiments, both the gate electrode and the field plate structure have a stepped configuration, which results in the gate electrode having at least one gate field plate (GFP), and the field plate structure having multiple source-connected field plates (SFPs). The field plate structure may result in a beneficial reduction in gate-drain capacitance, $C_{GD}$. In one or more embodiments, the field plate structure may be recessed with respect to at least one of the GFPs, which may further reduce $C_{GD}$. In addition, with multiple SFPs, the field plate structure is configured to ensure dielectric reliability and high break-down voltage. Fabrication methods disclosed herein result at least one of the GFPs and at least one of the SFPs being fully self-aligned with the gate channel. By self-aligning these device features, device-to-device variations in performance (e.g., variations in capacitances, gain, cut-off frequency, output power, and trapping) that may otherwise occur due to feature mis-alignment may be avoided. Further, in at least one embodiment, the gate structure is designed to have a relatively-low gate resistance, $R_G$, without incurring a significant increase in the gate-drain capacitance, $C_{GD}$ or the gate-source capacitance $C_{GS}$.

Figure 1:
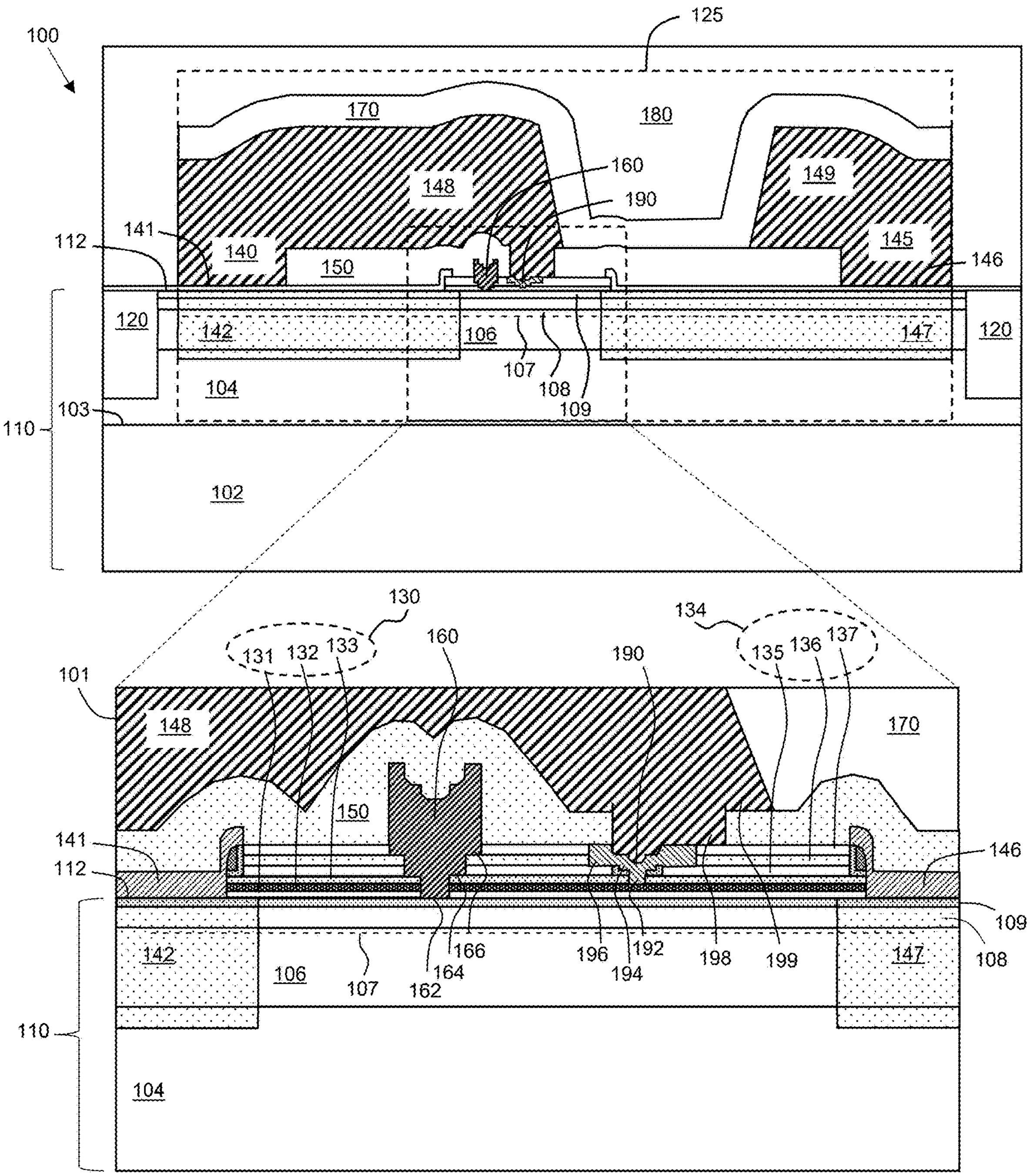
FIG. 1 is a cross-sectional, side view of an exemplary heterojunction field effect transistor (HFET), in accordance with an embodiment.

FIG. 1 is a cross-sectional, side view of an exemplary GaN heterojunction field effect transistor (HFET) device 100, in accordance with an embodiment. The upper image in FIG. 1 shows a comprehensive view of the GaN HFET device 100. In addition, for enhanced understanding, an enlarged view of a portion 101 of the GaN HFET device 100 is shown below the comprehensive view of device 100. Portion 101 corresponds to an embodiment of a transistor structure, the fabrication of which is described in detail below in conjunction with FIGS. 2-20.

The GaN HFET device 100 includes a semiconductor substrate 110, one or more isolation regions 120 and an active region 125. The active region is defined as the portion of device 100 that is located between the isolation regions 120. As will be described in detail below, various transistor structures are formed on and over the upper surface 112 of the semiconductor substrate 110, and a variably conductive channel 107 below the upper surface 112 of the semiconductor substrate 110 provides for current flow through the device 100.

In an embodiment, the semiconductor substrate 110 may include a host substrate 102, a buffer layer 104 disposed over an upper surface 103 of the host substrate 102, a channel layer 106 disposed over the buffer layer 104, and a barrier layer 108 disposed over the channel layer 106. In some embodiments, a cap layer 109 is disposed over the channel layer 106, and the cap layer 109 defines the upper surface 112 of the substrate 110. In other embodiments, the cap layer 109 may be excluded, and the barrier layer 108 may define the upper surface 112 of the substrate 110. In the drawings, the upper layer of the substrate 110 is shaded for enhanced distinguishability from the below-described layers that overlie the upper surface 112 of the substrate 110.

The host substrate 102 may include silicon carbide (SiC), or may include other materials such as sapphire, silicon (Si), gallium nitride (GaN), aluminum nitride (AlN), diamond, poly-SiC, silicon on insulator, gallium arsenide (GaAs), indium phosphide (InP), or other substantially insulating or high resistivity materials. A nucleation layer (e.g., AlN, not shown) may be formed on an upper surface 103 of the host substrate 102 between the buffer layer 104 and the host substrate 102. Embodiments of the buffer layer 104, the channel layer 106, the barrier layer 108, and the cap layer 109 may include materials selected from Si, AlN, GaN, indium phosphide (InP), aluminum gallium nitride (AlGaN), indium aluminum nitride (InAlN), indium gallium nitride (InGaN), and/or other suitable materials. Layers 104, 106, 108, and 109 may be epitaxially grown on the host substrate 102. Some of layers 104, 106, 108, and 109 may be intentionally doped with iron (Fe), chromium (Cr), carbon (C), magnesium (Mg), germanium (Ge) or other suitable dopant species.

In some embodiments, the barrier layer 108 has a larger bandgap and larger spontaneous polarization than the channel layer 106, and, when the barrier layer 108 is in direct contact with the channel layer 106, a channel 107 is created in the form of a two-dimensional electron gas (2-DEG) within the channel layer 106 near the interface between the channel layer 106 and the barrier layer 108. In addition, strain between the barrier layer 108 and channel layer 106 may cause additional piezoelectric charge to be introduced into the 2-DEG and channel 107. In some embodiments, an additional AlN interbarrier layer (not shown) may be formed between the channel layer 106 and the barrier layer 108. The AlN interbarrier layer may increase the channel charge, reduce electron alloy scattering yielding increased mobility, and improve the electron confinement of the resultant 2-DEG.

Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary, and that the function and operation of the various layers may be combined and may change depending on the materials used in any specific embodiment.

In other embodiments using N-polar materials, the channel layer 106 may be disposed over the barrier layer 108 to create a 2-DEG and channel 107 directly beneath the cap layer 109 and the gate electrode 160. Still further embodiments may include semiconductor layers formed from materials including GaAs, gallium oxide ($Ga_2O_4$) aluminum gallium arsenide (AlGaAs), indium gallium arsenide (InGaAs), and aluminum indium arsenide (AlInAs) to form the semiconductor substrate 110.

The isolation regions 120 may be formed via an implantation procedure configured to damage the epitaxial and/or other semiconductor layers to create high resistivity regions of the semiconductor substrate 110 (i.e., rendering the semiconductor substrate 110 highly resistive or semi-insulating in those high resistivity regions), while leaving the crystal structure intact in the active region 125. In other embodiments, the isolation regions 120 may be formed by removing one or more of the epitaxial and/or other semiconductor layers of the semiconductor substrate 110, rendering the remaining layers of the semiconductor substrate 110 semi-insulating and leaving behind active region "mesas" surrounded by high resistivity or semi-insulating isolation regions (not shown). In still other embodiments, the isolation regions 120 may be formed by removing one or more of the epitaxial and/or other semiconductor layers of the semiconductor substrate 110, and then using ion implantation to damage and further enhance the semi-insulating properties of the remaining layers of the semiconductor substrate 110 and leaving behind active region "mesas" surrounded by high resistivity or semi-insulating isolation regions 120 that have been implanted (not shown).

Within the active region 125, HFET device 100 includes a source electrode 140 (also referred to herein as a "first current-carrying electrode"), a source contact 141, a drain electrode 145 (also referred to herein as a "second current-carrying electrode"), a drain contact 146, a gate electrode 160 (also referred to herein as a "control electrode"), a source connected field plate (SFP) structure 190 (also referred to herein as a "field plate," "multi-step field plate," or "conductive field plate"), a source region 142, and a drain region 147. In an embodiment, GaN HFET device 100 may be configured as a transistor finger wherein the source electrode 140, the drain electrode 145, the gate electrode 160, and the SFP structure 190 may be configured as elongated elements forming a transistor "finger". To build up a high-power device, multiple instances of GaN HFET device 100 may be implemented in parallel with multiple drain electrodes 145 all coupled together, and with multiple gate electrodes 160 all coupled together.

The source and drain regions 142, 147 extend from the upper surface 112 of the substrate 110 to a depth below the upper surface 112. In some embodiments, ion implantation may be used to form the source and drain regions 142, 147, and these regions 142, 147 are located at opposite ends of the channel 107 at the upper surface 112 of the semiconductor substrate 110. In some embodiments, ion implantation may be used to form intentionally doped source and drain regions 142, 147, and accordingly, the source region 142 and the drain region 147 may be regions of the semiconductor substrate 110 into which source and drain dopants have been implanted. In other embodiments, rather than including intentionally-doped source and drain regions 142, 147, these areas of the substrate 110 may be not intentionally doped. Instead, after depositing the constituent layers of the Ohmic stack that form the source and drain contacts 141, 146, an annealing process may be performed to alloy the Ohmic stack, resulting in Ohmic contacts to the source and drain regions 142 and 147 of the semiconductor substrate 110 (i.e., to the 2-DEG of the channel 107). In still other embodiments, heavily doped (e.g., Si doped >1e19 $cm^{-3}$) epitaxially regrown layers may be formed over and in contact with the semiconductor substrate 110 in addition to or in place of the source and drain regions 142, 147 (not shown) and in the same location as source and drain regions 142, 147.

At the upper surface 112 of the substrate 110, the source contact 141 extends toward the source electrode 140 from its proximal end near the source side of the gate electrode 160. The source contact 141 overlies and contacts the cap layer 109 and the source region 142 along substantially all of the length of the source contact 141. In other embodiments, the source contact 141 may contact the barrier layer 108 if the cap layer 109 is excluded. In still other embodiments, the source contact 141 may be recessed into the semiconductor substrate 110. The source electrode 140 is disposed on or over a portion of the distal end of the source contact 141, and is electrically coupled to the SFP structure 190 through source metallization 148.

Similarly, at the upper surface 112 of the substrate 110, the drain contact 146 extends toward the drain electrode 145 from its proximal end near the drain side of the gate electrode 160. The drain contact 146 overlies and contacts the cap layer 109 and the drain region 147 along substantially all of the length of the drain contact 146. In other embodiments, the drain contact 146 may contact the barrier layer 108 if the cap layer 109 is excluded. In still other embodiments, the drain contact 146 may be recessed into the semiconductor substrate 110. The drain electrode 145 is disposed on or over a portion of the distal end of the drain contact 146, and is electrically coupled to a drain manifold (not illustrated) through drain metallization 149.

In one or more embodiments, the source and drain contacts 141, 146 are formed from a conductive layer (e.g., layer 830, FIG. 8), which may include one or more layers of titanium (Ti), titanium tungsten (TiW), titanium aluminum (TiAl), titanium-tungsten nitride (TiWN) or other materials that are suitable for forming an Ohmic contact in conjunction with the source and drain regions 142, 147. The source and drain electrodes 140, 145, which are formed from source and drain metallization 148, 149, overlie and contact the source and drain contacts 141, 146. The source and drain electrodes 140, 145 (and the metallization 148, 149) may be formed from a stack of multiple conductive layers. In some embodiments, the multi-layer stack used to form the source and drain electrodes 140, 145 and the source and drain metallization 148, 149 may include, for example, one or more layers of Ti, TiW, TiAl, TiWN, gold (Au), titanium-aluminum-gold (TiAlAu), Al, molybdenum (Mo), nickel (Ni), polysilicon, Ge, platinum (Pt), copper (Cu), tantalum (Ta), combinations of these materials, or other suitable materials.

In the embodiment of FIG. 1, the source metallization 148 is shown to extend from the source contact 141 over the gate electrode 160 to the SFP structure 190. This extension of the source metallization 148 may be continuous over the length of the transistor finger (i.e., along the dimension into the page). In other embodiments, to reduce capacitive coupling between the gate electrode 160 and the source metallization 148, the source metallization 148 may only cross over the gate electrode 160 to the SFP structure 190 in discrete locations along the length of the transistor finger. In other words, rather than being a continuous structure along the entire length of the transistor finger, the source metallization 148 may be implemented as one or more conductive "straps" that electrically couple the source contact 141 to the SFP structure 190 at one or more locations along the transistor finger. Thus the majority of the transistor finger may lack source metallization crossing over the gate electrode 160. In still other embodiments, the source metallization 148 may be positioned outside the active area 125 beyond the end of the transistor finger (not shown), in order to electrically couple the source contact 141 to the SFP structure 190. In both the other embodiments and still other embodiments, the same metal layer may be used to form SFP structure 190 and source metallization 148. However, separate metal layers alternatively may be used for the metal to form SFP structure 190 and source metallization 148, without limitation.

In an embodiment, a multi-layer surface passivation 130 (including at least first, second, and third surface passivation sub-layers 131, 132, 133) and a multi-layer, lowest, inter-layer dielectric (ILD0) 134 (including at least first, second, and third ILD0 sub-layers 135, 136, 137) are formed over the upper surface 112 of the semiconductor substrate 110 in the active region 125. Adjacent ones of these sub-layers 131-133, 135-137 are formed from different dielectric materials. Accordingly, adjacent sub-layers 131-133, 135-137 have different etch properties which, as will be described in more detail later, enable the formation of recessed features (e.g., a recessed portion of the SFP structure 190 (FIGS. 1 and 19) or alternate SFP structure 190' (FIG. 20)). For example, the various materials from which the surface passivation and ILD0 sub-layers 131-133, 135-137 may be formed include, but are not limited to, silicon dioxide ($SiO_2$), silicon nitride ($Si_3N_4$ or other stoichiometries), silicon oxynitride (SiON in various stoichiometries), aluminum oxide ($Al_2O_3$), aluminum nitride (AlN), and hafnium oxide ($HfO_2$), though other substantially insulating materials may be used. In the embodiment illustrated in FIG. 1, the surface passivation 130 includes three sub-layers 131-133. In other embodiments, the surface passivation may include more than three sub-layers.

The gate electrode 160 extends through all of the surface passivation and ILD0 sub-layers 131-133, 135-137. The gate electrode 160 is located above the upper surface 112 of the substrate 110 between the source and drain contacts 141, 146. During operation, the gate electrode 160 functions to modulate the conductivity of the channel 107 in response to a time-varying voltage applied to the gate electrode 160, thus modulating the current flow between the source and drain contacts 141, 146. The area of contact between the gate electrode 160 and the upper surface 112 of the substrate 110 is referred to herein as the "gate channel."

As mentioned previously and as will be described in detail below, the gate electrode 160 has a stepped configuration. The stepped configuration of the gate electrode 160 includes a gate channel portion 162 and multiple gate field plates (GFPs) 164, 166. The gate channel portion 162 is located at the gate channel, and has a horizontal (with respect to FIG. 1) bottom extent that defines the lowest portion of the gate electrode 160 (i.e., the portion contacting or closest to the upper substrate surface 112). A first GFP 164 (GFP1) is integrally-formed with the gate channel portion 162, and has a horizontal bottom extent that is higher than the bottom extent of the gate channel portion 162. More specifically, GFP1 164 overlies and contacts portions of a dielectric surface passivation layer (e.g., portions of surface passivation sub-layer 133). A second GFP 166 (GFP2) also is integrally-formed with the gate channel portion 162, and has a horizontal bottom extent that is higher than the bottom extents of both the gate channel portion 162 and GFP1 164. More specifically, GFP2 166 overlies and contacts portions of an additional dielectric layer (e.g., portions of layer 136). As shown in FIG. 1, the horizontal bottom extents of GFP1 164 and GFP2 166 project upwardly and outwardly from the gate channel portion 162 on both sides of the gate channel portion 162.

As used herein, when saying that the horizontal bottom extent of a first feature (e.g., GFP2 164) is "higher than" the horizontal bottom extent of a second feature (e.g., GFP1 162), it means that the first feature is farther from the upper surface 112 of the semiconductor substrate 110 than the second feature (i.e., there is thicker dielectric between the first feature and the upper surface 112 of the substrate 110 than the dielectric between the second feature and the upper surface 112 of the substrate 110). Similarly, as used herein, when saying that the horizontal bottom extent of a first feature (e.g., GFP1 162) is "lower than" the horizontal bottom extent of a second feature (e.g., GFP2 164), it means that the first feature is closer to the upper surface 112 of the semiconductor substrate 110 than the second feature (i.e., there is thinner dielectric between the first feature and the upper surface 112 of the substrate 110 than the dielectric between the second feature and the upper surface 112 of the substrate 110).

In at least one embodiment, the gate electrode 160 has a relatively large cross-sectional area, which may result in a relatively-low gate resistance, $R_G$, without incurring a significant increase in the gate-drain capacitance, $C_{GD}$, or gate-source capacitance $C_{GS}$. A Schottky contact is formed in the gate channel. For a low-loss, Schottky gate electrode 160, one or more Schottky materials such as nickel (Ni), palladium (Pd), platinum (Pt), iridium (Ir), or Copper (Cu), may be combined with one or more low stress conductive materials such as gold (Au), aluminum (Al), Cu, polysilicon, or other suitable material(s) in a metal stack to form the gate electrode 160, according to an embodiment. The gate electrode 160 may be characterized by a gate length where the gate electrode 160 contacts the substrate surface 112, and the gate length may be between about 0.05 microns and about 1 micron, in various embodiments. In other embodiments, the gate length may be between about 0.01 microns and about 5 microns, although other suitable dimensions may be used.

Without departing from the scope of the inventive subject matter, numerous other gate electrode embodiments may be realized. The exemplary embodiment of FIG. 1 depicts the gate electrode 160 as being disposed over the semiconductor substrate 110. In other embodiments (not shown), the gate electrode 160 may be recessed through the cap layer 109 and extend partially into the barrier layer 108, increasing the electrical coupling of the gate electrode 160 to the channel 107 through the barrier layer 108. In still other embodiments (not shown), the cap layer 109 may be omitted and the gate electrode 160 may contact the barrier layer 108 directly. In still other embodiments, the gate electrode 160 may be disposed over a gate insulator (not illustrated) that may be formed between the gate electrode 160 and the semiconductor substrate 110 to form a metal-insulator semiconductor field effect transistor (MISFET) device.

The SFP structure 190 (and alternate SFP structure 190', FIG. 20) extends through the ILD0 sub-layers 135-137, but only partially through the surface passivation 130 (i.e., the SFP structure 190, 190' is recessed below the upper surface of surface passivation 130). The SFP structure 190 is located above the upper surface 112 of the substrate 110 between the gate structure 160 and the drain contact 146. The SFP structure 190 functions to alter the electric field distribution, particularly at the drain-side edge of the gate electrode 160, potentially resulting in an increased breakdown voltage and a reduced high-field trapping effect for device 100.

As mentioned previously and as will be described in detail below, the SFP structure 190 (and alternate SFP structure 190') also has a stepped configuration. The stepped configuration of the SFP structure 190 includes multiple source-connected field plates (SFPs) 192, 194, 196, 198, 199, where the horizontal bottom extent of SFP1 192 is at a first level, and the horizontal bottom extents of SFP2 194, SFP3 196, SFP4 198, and SFP5 199 are at higher and higher levels (i.e., SFP2 194, SFP3 196, SFP4 198, and SFP5 199 project upwardly and outwardly from SFP1 192 on one or both sides of SFP1 192). Overall, the SFP structure 190 may result in a beneficial reduction in gate-drain capacitance, $C_{GD}$, when compared with conventional devices that lack a field plate. The multiple SFPs include a first SFP 192 (SFP1), which includes a horizontal bottom extent that is separated from the upper surface 112 of the substrate 110 by relatively-thin underlying dielectric material (e.g., portions of dielectric layers 131 and 132 for SFP structure 190, or a portion of only dielectric layer 131 for SFP structure 190'). In one or more embodiments, the bottom extent of SFP1 192 (or alternate SFP1 192') are at a lower level than the bottom extents of GFP1 164 and GFP2 166 (i.e., SFP1 192 and SFP1 192' have thinner underlying dielectric material than GFP1 164 and GFP2 166), which may result in a reduction of $C_{GD}$. The lower gate drain capacitance, $C_{GD}$, in turn, may result in increased gain for the device 100. In addition, multiple additional SFPs (e.g., SFP2 194, SFP3 196, SFP4 198, SFP5 199, etc.), each with increasingly thicker underlying dielectric material (i.e., higher and higher horizontal bottom extents), are provided to relieve the electric field at the edge of SFP1 192 (or alternate SFP1 192'), so as to ensure dielectric reliability and to improve break-down.

In various embodiments, the SFP structure 190 (and alternate SFP structure 190') may be formed using one or more conductive layers. For example, the SFP structure 190 may be a structure formed from titanium (Ti), Au, Al, molybdenum (Mo), Ni, Si, Ge, Pt, Cu, Ta, combinations of these materials, or other suitable materials. In other embodiments, the one or more conductive layers used to form the SFP structure 190 may include titanium tungsten (TiW), titanium aluminum (TiAl), or titanium tungsten nitride (TiWN).

As will be discussed in more detail below, embodiments of fabrication methods for device 100 ensure that at least SFP1 192 and SFP2 194 are fully self-aligned with the gate channel portion 162. By self-aligning these device features, device-to-device variations in performance (e.g., variations in capacitances, gain, cut-off frequency, output power, and trapping) that may otherwise occur due to feature misalignment may be avoided. According to an embodiment, the self-aligned gate channel portion 162, SFP1 192 (or SFP1 192'), and SFP2 194 are made possible, in part, by simultaneously forming gate and field plate openings (e.g., openings 460, 490, FIG. 4) through ILD0 134, as will be described in detail later.

One or more additional dielectric layers 150, 170, 180 are disposed over the surface passivation and ILD0 sub-layers 131-133, 135-137, the gate electrode 160, and the SFP structure 190, according to various embodiments. For example, the additional dielectric layers 150, 170, 180 may be formed from one or more suitable materials including silicon dioxide ($SiO_2$), organo-silicate glass, porous silicon dioxide, silicon nitride ($Si_3N_4$), silicon oxynitride (SiON), aluminum oxide ($Al_2O_3$), aluminum nitride (AlN), and hafnium oxide ($HfO_2$), though other substantially insulating materials may be used.

As used herein, the term, "low-k dielectric material" refers to a dielectric material having a dielectric constant below about 5.0, and the term, "high-k dielectric material" refers to a dielectric material having a dielectric constant above about 5.0. In an embodiment, the additional dielectric layers 150, 170, 180 may be formed from low-k dielectric material(s). The relatively low dielectric constant for dielectric layer 150 may reduce the parasitic capacitance between the gate electrode 160 and the source metallization 148 and SFP structure 190, and also may reduce the parasitic capacitance between the drain electrode 145 and field plate structure 190, in some embodiments.

The dielectric constant of the surface passivation and ILD0 sub-layers 131-133, 135-137 may exceed the dielectric constant of the additional dielectric layers 150, 170, 180. Further, the dielectric constant of sub-layers 131-133, 135 may exceed the dielectric constant of the upper ILD0 sub layers 136, 137.

Figure 2:
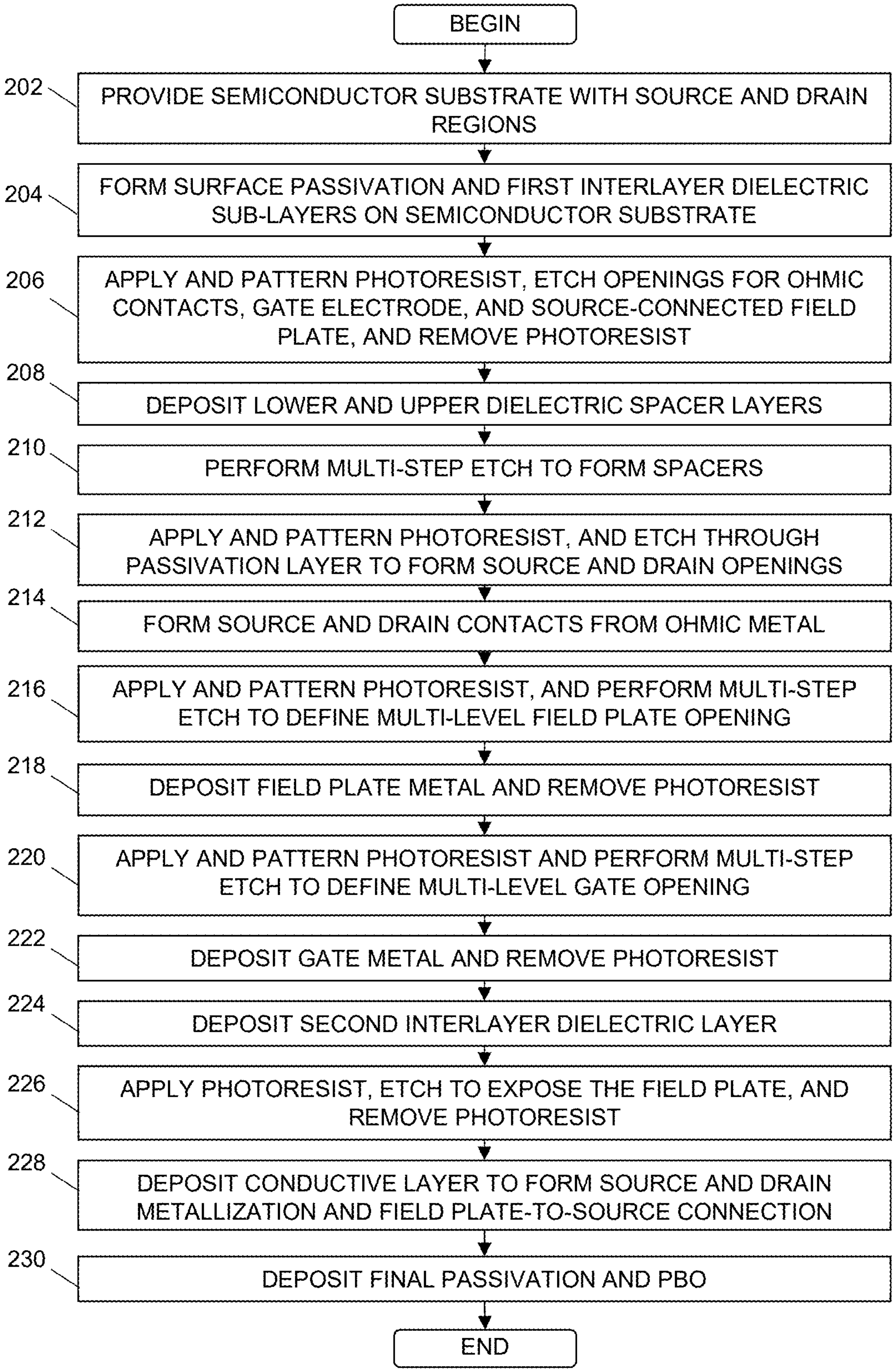
FIG. 2 is a process flow diagram describing embodiments of methods for fabricating various embodiments of the heterojunction field effect transistor (HFET) devices of FIGS. 1 and 3-20.
Figure 18:
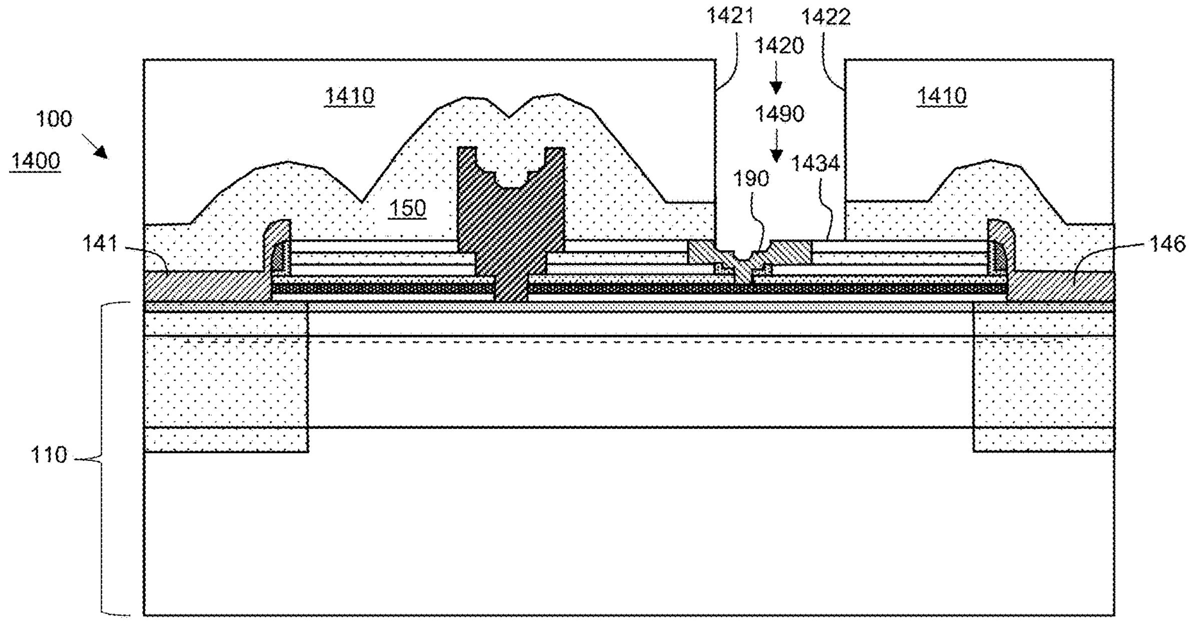
Figure 19:
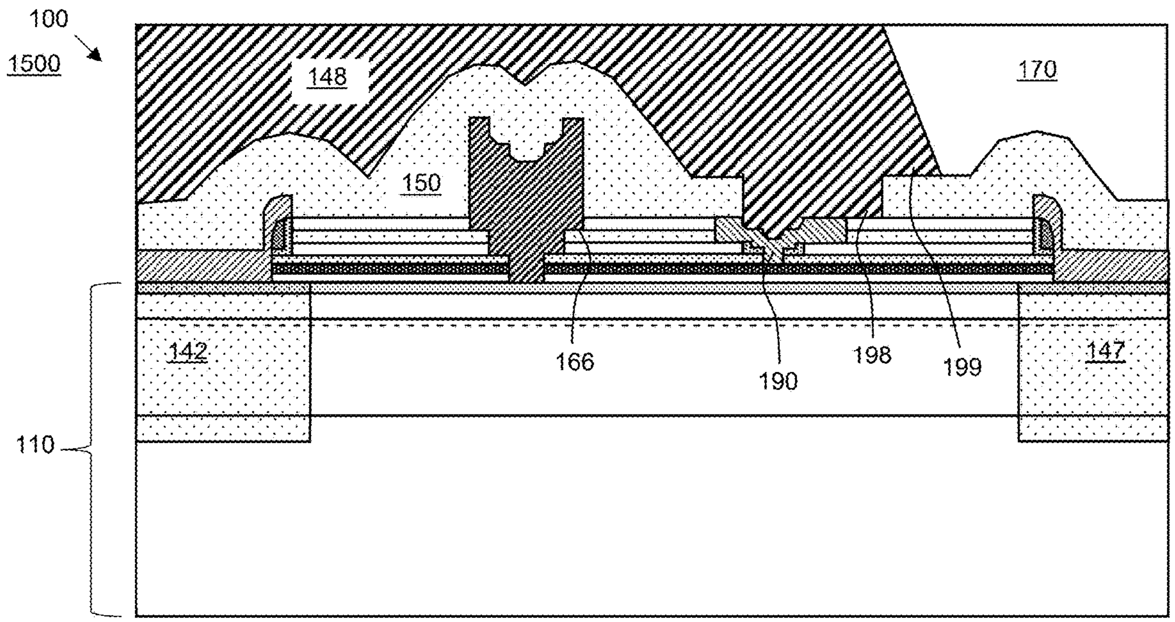
Figure 20:
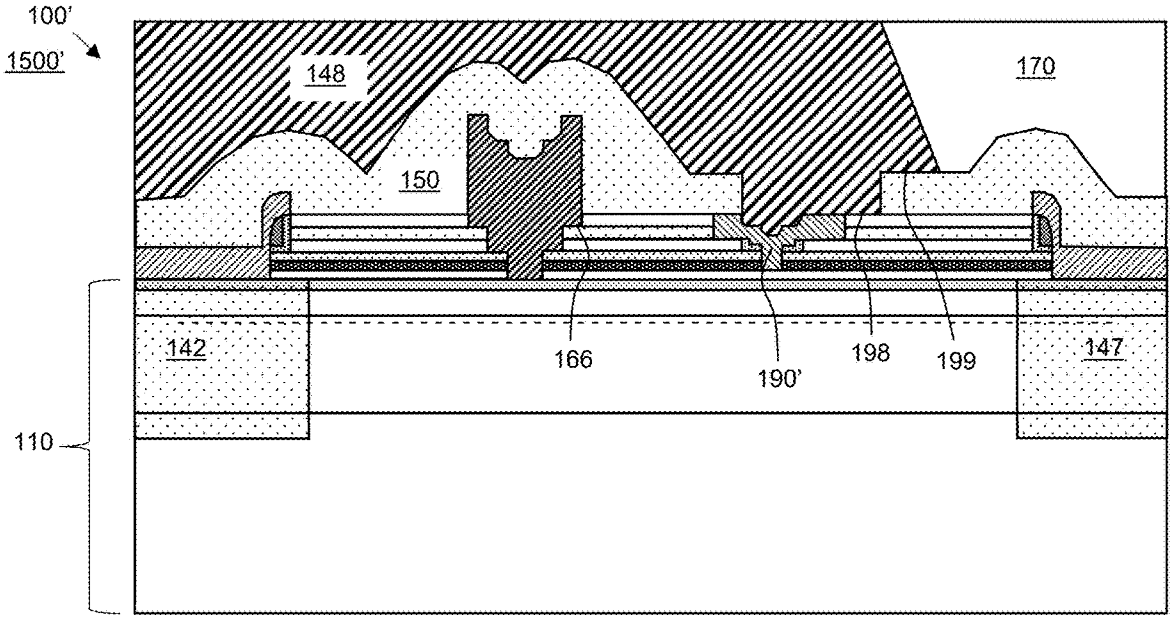

FIG. 2 is a process flow diagram describing embodiments of methods for fabricating the GaN HFET device 100 of FIG. 1 and FIG. 19, as well as methods for fabricating alternate embodiments of GaN HFET devices (e.g., device 100', FIG. 20). For enhanced understanding, FIG. 2 should be viewed in conjunction with FIGS. 3-20, which are cross-sectional, side views of portion of GaN HFET devices 100, 100' during a sequence of fabrication steps. It should be understood that the depicted portions 100, 100' of embodiments of GaN HFET devices shown in FIGS. 19 and 20 may be swapped out for portion 101 in the device 100 shown in FIG. 1. Accordingly, although FIGS. 3-20 only depict portions of GaN HFET devices, those GaN HFET devices also would include other adjacent device structures, such as those shown to the left and right of portion 101 in the upper image in FIG. 1 (e.g., the other GaN HFET devices would include host substrate 102, source and drain regions 142, 147, source and drain electrodes 140, 145, source and drain contacts 141, 146, isolation regions 120, and so on).

Referring initially to FIGS. 1 and 2, fabrication of GaN HFET device 100 begins, in block 202, by providing a semiconductor substrate 110. As mentioned previously, in at least one embodiment, providing the semiconductor substrate 110 may include providing a host substrate 102 and forming a number of semiconductor layers on or over the host substrate 102. For example, the host substrate 102 may include SiC, or may include other materials such as sapphire, Si, GaN, AlN, diamond, poly-SiC, silicon on insulator, GaAs, InP, or other substantially insulating or high resistivity materials. Forming the overlying semiconductor layers may include forming a nucleation layer (not shown) on or over an upper surface 103 of the host substrate 102, forming a buffer layer 104 on or over the nucleation layer, forming a channel layer 106 on or over the buffer layer 104, forming a barrier layer 108 on or over the channel layer 106, and optionally forming a cap layer 109 on or over the barrier layer 108. Embodiments of the buffer layer 104, the channel layer 106, the barrier layer 108, and the cap layer 109 may include materials selected from Si, AlN, GaN, InP, AlGaN, InAlN, InGaN, or other suitable materials. The semiconductor layers 104, 106, 108, and 109 may be epitaxially grown using one of metal organic chemical vapor deposition (MOCVD), molecular beam epitaxy (MBE), hydride-vapor phase epitaxy (HVPE) or a combination of these techniques, although other suitable techniques may alternatively be used. Some of layers 104, 106, 108, and 109 may be intentionally doped with Fe, Cr, C, Mg. Ge or other suitable dopant species.

At this stage or later, source and drain regions 142, 147 may be formed through the upper surface 112 of the semiconductor substrate 110. Forming source and drain regions 142 and 147 may include forming a sacrificial dielectric layer (e.g., selected from $Si_3N_4$, $Al_2O_3$, $SiO_2$, AlN, and $HfO_2$) on or over the semiconductor substrate 110. An implant mask may then be formed on the sacrificial dielectric layer, and a dopant species (e.g., selected from one or more of Si, Ge, O, or other suitable n-type dopant(s)) is implanted through openings in the implant mask into the semiconductor substrate 110 to form source and drain implant regions within the semiconductor substrate. The implant mask then may be removed (e.g., using one or more conventional wet chemical and plasma ashing technique(s)). The implant regions then may be activated (e.g., by annealing the semiconductor substrate 110) to form the source and drain regions 142, 147. The sacrificial dielectric layer is then removed (e.g., using wet or dry etching).

Figure 3:
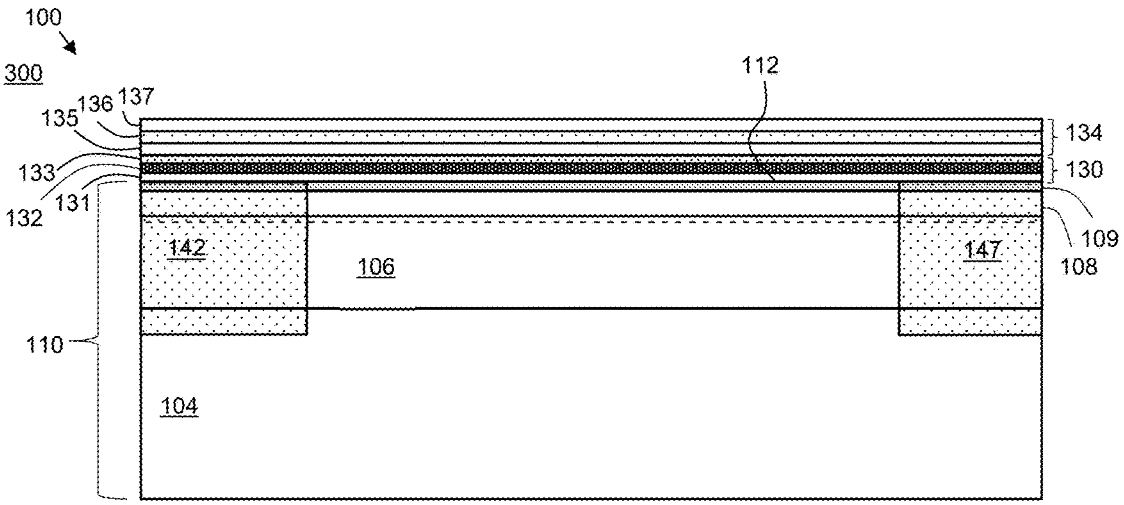
FIGS. 3, 4, 5, 6, 7, 8, 9, 10, 11, 12, 13, 14, 15, 16, 17, 18, 19, and 20 are cross-sectional, side views of an embodiment of an HFET device during a sequence of fabrication steps, according to an example embodiment.

Referring now to FIGS. 2 and 3, in block 204 and fabrication stage 300 (FIG. 3), a multi-layer surface passivation 130 (including at least lower, intermediate, and upper surface passivation sub-layers 131, 132, 133) is formed on or over the upper surface 112 of the semiconductor substrate 110. In addition, a multi-layer, lowest, inter-layer dielectric (ILD0) 134 (including at least first, second, and third ILD0 sub-layers 135, 136, 137) is formed on or over the multi-layer surface passivation 130. According to an embodiment, adjacent pairs of sub-layers are formed from different dielectric materials to enable etch selectivity. To enhance the ability to distinguish the various sub-layers 131, 132, 133, 135, 136, 137, sub-layers 132, 133 and 136 are filled with stippled patterns in some of the Figures. The patterning is not meant to imply that sub-layers 131, 135, 137 are formed from the same material, or that sub-layers 132, 133, and 136 are formed from the same material, although some of these layers may be formed from the same material, in some embodiments.

According to an embodiment, adjacent pairs of sub-layers are formed from different dielectric materials to enable etch selectivity (e.g., the adjacent sub-layers are etchable using different etch chemistries to enable self-alignment of the gate channel 162, SFP1 192, 192', and SFP2 194 and the formation of the stepped configurations of the gate electrode 160 and the SFP structures 190, 190'). More specifically, sub-layer 131 is formed from a different dielectric material than sub-layer 132, sub-layer 132 is formed from a different dielectric material than sub-layer 133, sub-layer 133 is formed from a different dielectric material than sub-layer 135, sub-layer 135 is formed from a different dielectric material than sub-layer 136, and sub-layer 136 is formed from a different dielectric material than sub-layer 137.

In particular, as described below in conjunction with various fabrication stages, each underlying sub-layer 131-133, 135, 136 may function as an etch stop when etching through each overlying sub-layer 132, 133, 135-137 using any given etch chemistry. For example, the etch chemistry (or chemistries) that are used, as described later, to etch the upper surface passivation sub-layer 133 may have a high etch selectivity between the materials of the upper and intermediate surface passivation sub-layers 133, 132, and the etch chemistry (or chemistries) that are used to etch the intermediate surface passivation sub-layer 132 may have a high etch selectivity between the materials of the intermediate and lower surface passivation sub-layers 132, 131. As is understood by those of skill in the art, etch selectivity is the ratio of etch rates between materials. In the present case, the etch selectivity for an etchant used to etch the upper surface passivation sub-layer 133 may be defined as the ratio between the etch rate for the material of the upper surface passivation sub-layer 133 ("etch rate 133") to the etch rate for the material of the intermediate surface passivation sub-layer 132 ("etch rate 132") (i.e., the etch selectivity for the etchant used to etch the upper surface passivation sub-layer 133 equals etch rate 133/etch rate 132). Further, an etchant with "low selectivity" to a certain material is configured to etch that material at a relatively high rate, whereas an etchant with "high selectivity" to a certain material is not configured to etch that material at a high rate (or at all).

The three layers of the surface passivation 130 are first formed on the upper surface 112 of the semiconductor substrate 110. The lower surface passivation sub-layer 131 is formed directly on the upper surface 112 of the semiconductor substrate 110 (e.g., on cap layer 109, if included, or on barrier layer 108 if cap layer 109 is excluded). According to various embodiments, the lower surface passivation sub-layer 131 may have a thickness in a range of about 50 angstroms to about 1000 angstroms, although layer 131 may be thinner or thicker, as well.

Figure 16:
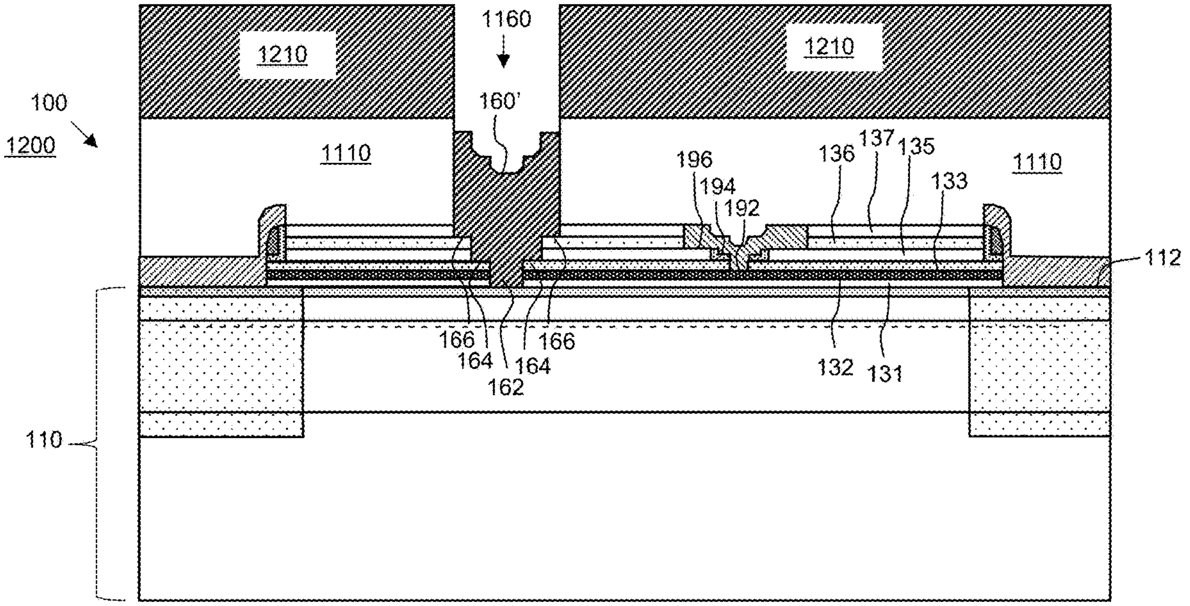

According to some embodiments, the lower surface passivation sub-layer 131 may be formed from silicon nitride ($Si_3N_4$, including silicon-rich or silicon-poor compositions thereof) although layer 131 alternatively may be formed from another dielectric material. The lower surface passivation sub-layer 131 may be formed using low pressure chemical vapor deposition (LPCVD), although layer 131 alternatively may be formed using a different deposition method (e.g., atomic layer deposition (ALD), sputtering, physical vapor deposition (PVD), plasma-enhanced chemical vapor deposition (PECVD), metal organic CVD (MOCVD), molecular beam epitaxy (MBE), inductively coupled plasma (ICP) deposition, electron cyclotron resonance (ECR) deposition, plasma enhanced ALD (PEALD), or other suitable techniques). As will be described later in conjunction with fabrication stage 900' (FIG. 11), the lower surface passivation sub-layer 131 functions as an etch stop during the formation of an embodiment of a field plate opening (e.g., opening 990', FIG. 11). Essentially, this enables the bottom extent 192' of an embodiment of the field plate structure 190' (FIG. 13) to be recessed below the upper surface of the surface passivation layer 130 and below GFP1 164 (FIG. 16).

The intermediate surface passivation sub-layer 132 is formed directly on the lower surface passivation sub-layer 131. According to various embodiments, the intermediate surface passivation sub-layer 132 may have a thickness in a range of about 50 angstroms to about 1000 angstroms, although layer 132 may be thinner or thicker, as well.

According to some embodiments, the intermediate surface passivation sub-layer 132 may be formed from silicon dioxide ($SiO_2$), although layer 132 alternatively may be formed from another dielectric material. The intermediate surface passivation sub-layer 132 may be formed using LPCVD, and/or using a different deposition method (e.g., sputtering, ALD, PEALD, PVD, PECVD, MOCVD, MBE, ICP deposition, ECR deposition, or other suitable techniques). As will be described later in conjunction with fabrication stage 900 (FIG. 10), the intermediate surface passivation sub-layer 132 functions as an etch stop during the formation of another embodiment of a field plate opening (e.g., opening 990, FIG. 10). Essentially, this enables the bottom extent 192 of another embodiment of the field plate structure 190 (FIG. 12) also to be recessed below GFP1 164 (FIG. 16).

According to an embodiment, the upper surface passivation sub-layer 133 is formed directly on the intermediate surface passivation sub-layer 132. According to various embodiments, the upper surface passivation sub-layer 133 may have a thickness in a range of about 50 angstroms to about 1000 angstroms, although layer 133 may be thinner or thicker, as well. Accordingly, in one or more embodiments, the total thickness of surface passivation 130 (including the thicknesses of sub-layers 131-133) may be between about 150 angstroms and about 3000 angstroms, although other thicknesses may be used.

According to some embodiments, the upper surface passivation sub-layer 133 may be formed from aluminum oxide ($Al_2O_3$) or aluminum nitride (AlN), although layer 133 alternatively may be formed from another dielectric material (e.g., $Si_3N_4$ or $HfO_2$). The upper surface passivation sub-layer 133 may be formed using sputtering, ALD or PEALD, and/or using a different deposition method (e.g., LPCVD, PVD, PECVD, MOCVD, MBE, ICP deposition, ECR deposition, or other suitable techniques). Forming the upper surface passivation sub-layer 133 completes the formation of surface passivation 130. According to various embodiments, the materials of layers 131-133 are predominantly high-k dielectric materials configured to provide high dielectric voltage withstand capability for a low equivalent oxide thickness.

The three layers of ILD0 134 are then formed on the surface passivation 130. According to an embodiment, the lower ILD0 sub-layer 135 is formed directly on the upper surface passivation sub-layer 133. According to various embodiments, the lower ILD0 sub-layer 135 may have a thickness in a range of about 500 angstroms to about 2000 angstroms, although layer 135 may be thinner or thicker, as well.

According to an embodiment, and as indicated above, the lower ILD0 sub-layer 135 is formed from a dielectric material that has a very high etch rate, in comparison with the etch rate of the upper surface passivation sub-layer 133, when exposed to the etch chemistry that will be subsequently used to etch the lower ILD0 sub-layer 135 (e.g., as described later in conjunction with block 206 and FIG. 4). For example, and according to some embodiments, the lower ILD0 sub-layer 135 may be formed from silicon nitride ($Si_3N_4$, including silicon-rich or silicon-poor compositions thereof), or other suitable materials. The lower ILD0 sub-layer 135 may be formed using LPCVD, and/or using a different deposition method (e.g., sputtering, ALD, PEALD, PVD, PECVD, MOCVD, MBE, ICP deposition, ECR deposition, or other suitable techniques).

According to an embodiment, the intermediate ILD0 sub-layer 136 is formed directly on the lower ILD0 sub-layer 135. According to various embodiments, the intermediate ILD0 sub-layer 136 may have a thickness in a range of about 500 angstroms to about 2000 angstroms, although layer 136 may be thinner or thicker, as well.

According to an embodiment, and as indicated above, the intermediate ILD0 sub-layer 136 is formed from a dielectric material that has a very high etch rate, in comparison with the etch rate of the lower ILD0 sub-layer 135, when exposed to the etch chemistry that will be subsequently used to etch the intermediate ILD0 sub-layer 136 (e.g., as described later in conjunction with block 216 and FIG. 10). For example, and according to some embodiments, the intermediate ILD0 sub-layer 136 may be formed from silicon dioxide ($SiO_2$), or other suitable materials. The intermediate ILD0 sub-layer 136 may be formed using LPCVD, and/or using a different deposition method (e.g., sputtering, ALD, PEALD, PVD, PECVD, MOCVD, MBE, ICP deposition, ECR deposition, or other suitable techniques).

According to an embodiment, the upper ILD0 sub-layer 137 is formed directly on the intermediate ILD0 sub-layer 136. According to various embodiments, the upper ILD0 sub-layer 137 may have a thickness in a range of about 500 angstroms to about 2000 angstroms, although layer 137 may be thinner or thicker, as well. Accordingly, in one or more embodiments, the total thickness of ILD0 134 (including the thicknesses of sub-layers 135-137) may be between about 1500 angstroms and about 6000 angstroms, although other thicknesses may be used.

According to an embodiment, and as indicated above, the upper ILD0 sub-layer 137 is formed from a dielectric material that has a very high etch rate, in comparison with the etch rate of the intermediate ILD0 sub-layer 136, when exposed to the etch chemistry that will be subsequently used to etch the upper ILD0 sub-layer 137 (e.g., as described later in conjunction with block 220 and FIG. 15). For example, and according to some embodiments, the upper ILD0 sub-layer 137 may be formed from silicon nitride ($Si_3N_4$, including silicon-rich or silicon-poor compositions thereof), or other suitable materials. The upper ILD0 sub-layer 137 may be formed using LPCVD, and/or using a different deposition method (e.g., sputtering, ALD, PEALD, PVD, PECVD, MOCVD, MBE, ICP deposition, ECR deposition, or other suitable techniques).

Figure 4:
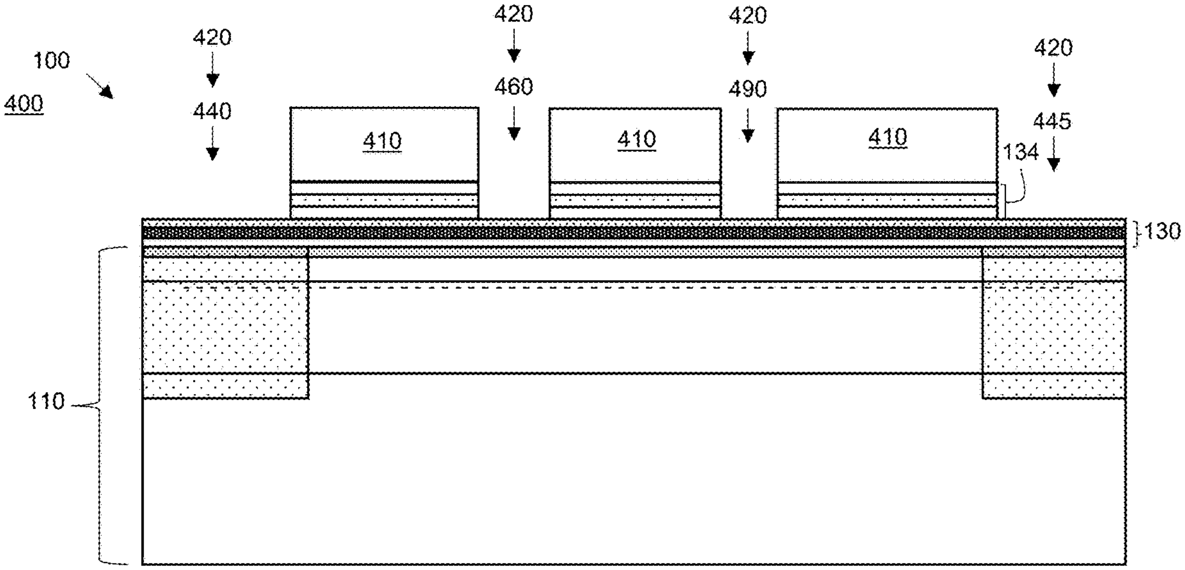

Referring now to FIGS. 1, 2, and 4, in block 206 and fabrication stage 400 (FIG. 4), openings 440, 445, 460, 490 for the to-be-formed source and drain Ohmic contacts 141, 146 (FIG. 1), the gate electrode 160 (FIG. 1) and the SFP 190 (FIG. 1, 19) (or SFP 190', FIG. 20) are formed through ILD0 134 (but not through surface passivation 130) over the source and drain regions 142, 147, and over the ultimate locations of the gate electrode 160 and the SFP 190 using sequential or simultaneous etching processes with suitable selectivity to stop on surface passivation 130.

For example, to form the openings 440, 445, 460, 490, a photoresist layer 410 may be deposited over the upper surface of ILD0 134 (i.e., on the upper surface of ILD0 sub-layer 137), and photoresist openings 420 may be formed over the locations where the openings 440, 445, 460, 490 in ILD0 134 are to be formed (including over the source and drain regions 142, 147, and the ultimate locations of the gate electrode 160 and the SFP 190, 190', FIGS. 1, 19, 20). The various sub-layers 137, 136, 135 of ILD0 134 may then be etched sequentially or simultaneously through the resist openings with suitable selectivity to stop on the upper surface passivation sub-layer 133.

Multiple dry and/or wet etch technique(s) may be used to etch the openings 440, 445, 460, 490 through the sub-layers 137, 136, 135. For example, the openings 440, 445, 460, 490 may be formed using reactive ion etching (RIE), inductively coupled plasma (ICP) etching, electron cyclotronic resonance (ECR) etching, atomic layer etching (ALE), and wet chemical etching, according to various embodiments. Dry etching may be preferable over wet etching because a dry etch etches substantially anisotropically (i.e., resulting in substantially vertical sidewalls).

In one or more embodiments, a single etchant (e.g., a fluorine based chemistry) may be used to etch through all of sub-layers 137, 136, 135, while stopping on surface passivation sub-layer 133 (e.g., the etchant has low selectivity between $Si_3N_4$ and $SiO_2$, but high selectivity to $Al_2O_3$). In other embodiments, multiple etchants may be used to sequentially etch through all of the sub-layers 137, 136, 135. For example, the etchant used to etch the upper ILD0 sub-layer 137 (e.g., $Si_3N_4$) may selectively etch through the upper ILD0 sub-layer 137 and then stop on the intermediate ILD0 sub-layer 136. Thus, the etchant should have high selectivity to the material of the underlying intermediate ILD0 sub-layer 136 (i.e., the etchant should not be designed to significantly etch the underlying intermediate ILD0 sub-layer 136). After etching through the ILD0 sub-layer 137, the etchant used to etch the intermediate ILD0 sub-layer 136 (e.g., $SiO_2$) may selectively etch through the intermediate ILD0 sub-layer 136 and then stop on the lower ILD0 sub-layer 135. Thus, the etchant should have high selectivity to the material of the underlying lower ILD0 sub-layer 135 (i.e., the etchant should not be designed to significantly etch the underlying lower ILD0 sub-layer 135). Finally, the etchant used to etch the lower ILD0 sub-layer 135 (e.g., $Si_3N_4$) may selectively etch through the lower ILD0 sub-layer 135 and then stop on the upper surface passivation sub-layer 133. Thus, the etchant should have high selectivity to the material of the underlying upper surface passivation sub-layer 133 (i.e., the etchant should not be designed to significantly etch the underlying upper surface passivation sub-layer 133).

To etch through the upper ILD0 sub-layer 137, suitable dry etching techniques may use, for example but not by way of limitation, a fluorine based chemistry (e.g., one or more of sulfur hexafluoride ($SF_6$), carbon tetrafluoride ($CF_4$) or other suitable chemistries), according to various embodiments. Alternatively, suitable wet-etch chemistries may be used.

The intermediate ILD0 sub-layer 136 (e.g., $SiO_2$) subsequently may be dry etched using suitable techniques (e.g., RIE, ICP, or ECR) in conjunction a fluorine based chemistry (e.g., the same as for layer 137), a chlorine based chemistry, or another suitable dry-etch chemistry, in various embodiments. Alternatively, suitable wet-etch chemistries may be used.

Finally, the lower ILD0 sub-layer 135 (e.g., $Si_3N_4$) subsequently may be dry etched using suitable techniques (e.g., RIE, ICP, or ECR) in conjunction a fluorine based chemistry (e.g., the same as for layer 137) or other suitable dry-etch chemistries. Alternatively, suitable wet-etch chemistries may be used. Once the etching processes are completed, patterned photoresist 410 is removed.

At this stage, the Ohmic source and drain regions 142, 147 may be processed for self-alignment if the various materials of the surface passivation 130 and ILD0 134 can be retained in a high-temperature anneal. Alternatively, in other embodiments, self-aligned Ohmic doping could be provided by selective epitaxy after removing the passivation layer only in the areas of the Ohmic source and drain regions 142, 147 (e.g., after block 212 and fabrication stage 700, FIG. 7). In these other embodiments, self-aligned Ohmic doping may be provided by selective epitaxy instead of by Ohmic source and drain implants (i.e., source and drain regions 142, 147 are omitted).

Figure 5:
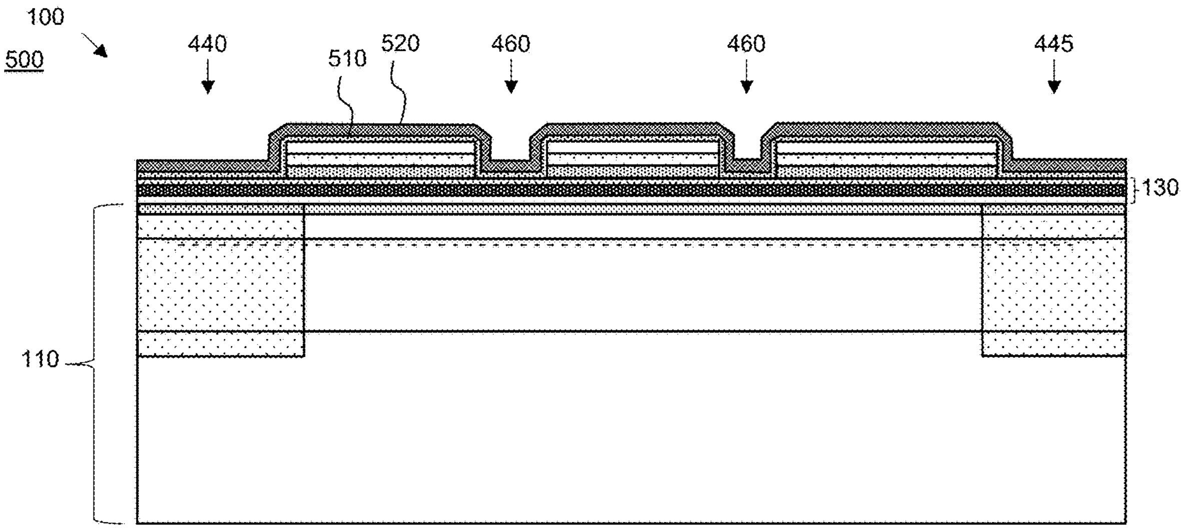

Referring now to FIGS. 1, 2, and 5, in block 208 and fabrication stage 500 (FIG. 5), lower and upper conformal dielectric spacer layers 510, 520 are then formed. First, a lower conformal dielectric spacer layer 510 is deposited over the upper surfaces of the remaining portions of ILD0 134, over the portions of the surface passivation 130 that are exposed through openings 440, 445, 460, and 490 (i.e., portions of the upper surface passivation sub-layer 133 exposed through openings 440, 445, 460, and 490), and on the sidewalls of openings 440, 445, 460, and 490 (i.e., on the sidewalls of the etched-through sub-layers 135-137). According to various embodiments, the lower conformal dielectric spacer layer 510 may have a thickness in a range of about 50 angstroms to about 300 angstroms, although layer 510 may be thinner or thicker, as well. According to some embodiments, the lower conformal dielectric spacer layer 510 may be formed from silicon nitride ($Si_3N_4$, including silicon-rich or silicon-poor compositions thereof), or other suitable materials.

After forming the lower conformal dielectric spacer layer 510, an upper conformal dielectric spacer layer 520 is formed on or over the lower conformal dielectric spacer layer 510, including on all horizontal and vertical surfaces of the lower conformal dielectric spacer layer 510. According to various embodiments, the upper conformal dielectric spacer layer 520 may have a thickness in a range of about 500 angstroms to about 2000 angstroms, although layer 520 may be thinner or thicker, as well. The upper conformal dielectric spacer layer 520 is formed from a different material than the lower conformal dielectric spacer layer 510 to provide for etch selectivity between the two layers 510, 520. According to some embodiments, the upper conformal dielectric spacer layer 520 may be formed from silicon dioxide ($SiO_2$), or other suitable materials.

The lower and upper conformal dielectric spacer layers 510, 520 each may be formed using atomic layer deposition (ALD), which is well suited to forming thin conformal layers, and/or using a different deposition method (e.g., LPCVD, sputtering, PEALD, PVD, PECVD, MOCVD, MBE, ICP deposition, ECR deposition, or other suitable techniques).

Figure 6:
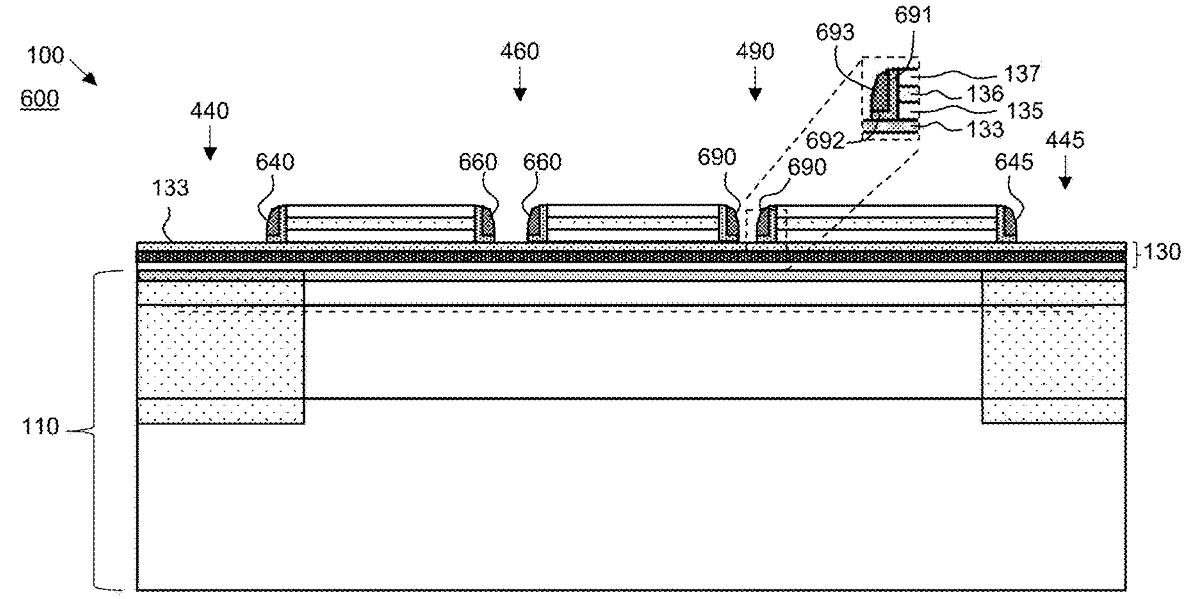

Referring now to FIGS. 1, 2, and 6, in block 210 and fabrication stage 600 (FIG. 6), a multi-step etching process is then performed to form multi-layer dielectric spacers 640, 645, 660, 690 from portions of the lower and upper conformal dielectric spacer layers 510, 520. For convenience of description, and due to their proximity to other to-be-formed features, dielectric spacer 640 may be referred to as a source dielectric spacer, dielectric spacer 645 may be referred to as a drain dielectric spacer, dielectric spacers 660 may be referred to as gate dielectric spacers, and dielectric spacers 690 may be referred to as field plate dielectric spacers 690.

First, the upper conformal dielectric spacer layer 520 (e.g., $SiO_2$) is anisotropically etched until the lower conformal dielectric spacer layer 520 is exposed. As shown in FIG. 6, this results in portions of the upper conformal dielectric spacer layer 520 remaining on the vertical sidewalls of the lower conformal dielectric spacer layer 510, and those remaining portions extend a short distance from the vertical sidewalls over horizontal surfaces of the lower conformal dielectric spacer layer 510.

For example, the upper conformal dielectric spacer layer 520 may be dry etched using suitable techniques (e.g., RIE, ICP, or ECR) in conjunction with a fluorine based chemistry (e.g. HF or $CF_4$+$H_2$ plasma). The etchant should have high selectivity to the material of the underlying lower conformal dielectric spacer layer 510 (e.g., $Si_3N_4$) and also high selectivity to the material of the upper ILD0 sub-layer 137 (e.g. $Si_3N_4$) (i.e., the etchant should not be designed to significantly etch the lower conformal dielectric spacer layer 510 or the upper ILD0 sub-layer 137).

After etching the upper conformal dielectric spacer layer 520, the lower conformal dielectric spacer layer 510 (e.g., $Si_3N_4$) is then anisotropically etched until the upper surface passivation sub-layer 133 is exposed. As shown in FIG. 6, this results in the removal of exposed portions of the lower conformal dielectric spacer layer 510 that are not covered by the remaining portions of the upper conformal dielectric spacer layer 520, while not removing portions of the lower conformal dielectric spacer layer 510 that are covered by the remaining portions of the upper conformal dielectric spacer layer 520.

For example, suitable dry etching techniques to etch the lower conformal dielectric spacer layer 510 may use, for example but not by way of limitation, one or more of $SF_6$+$O_2$, $CF_4$+$O_2$, $NF_3$+$N_2$+$O_2$+$H_2$ or other suitable chemistries, according to various embodiments. The etchant should have high selectivity to the material of the remaining portions of the upper conformal dielectric layer 520 and to the material of the upper surface passivation sub-layer 133 (i.e., the etchant should not be designed to significantly etch the remaining portions of the upper conformal dielectric layer 520 or the upper surface passivation sub-layer 133).

Once the etching processes are completed, multi-layer dielectric spacers 640, 645, 660, 690 remain adjacent to the sidewalls of openings 440, 445, 460, 490. For example, the gate dielectric spacers 660 are formed on sidewalls of ILD0 134 that are exposed in the gate opening 460, and the field plate dielectric spacers 690 are formed on sidewalls of ILD0 134 that are exposed in the field plate opening 490. Each of the dielectric spacers 640, 645, 660, 690 includes an "L-shaped" portion of the lower conformal dielectric spacer layer 510, and an overlying portion of the upper conformal dielectric spacer layer 520. As shown in the enlarged view of the right field plate spacer 690, for each of the dielectric spacers 640, 645, 660, 690, the "L-shaped" portion of the lower conformal dielectric spacer layer 510 includes a vertical spacer portion 691 that contacts the sidewalls of the ILD0 sub-layers 135-137, and a horizontal spacer portion 692 that contacts the upper surface passivation sub-layer 133. In addition, the overlying portion of the upper conformal dielectric spacer layer 520, referred to herein as the upper dielectric spacer portion 693, contacts both the vertical and horizontal spacer portions 691, 692. It should be noted here that the horizontal spacer portion 692 has a thickness that is less than the thickness of the lower ILD0 sub layer 135 (e.g., the thickness of portion 692 may be between about 10 percent and about 90 percent of the thickness of the lower ILD0 sub-layer 135, or between about 30 percent and about 70 percent of the thickness of the lower ILD0 sub-layer 135).

Figure 7:
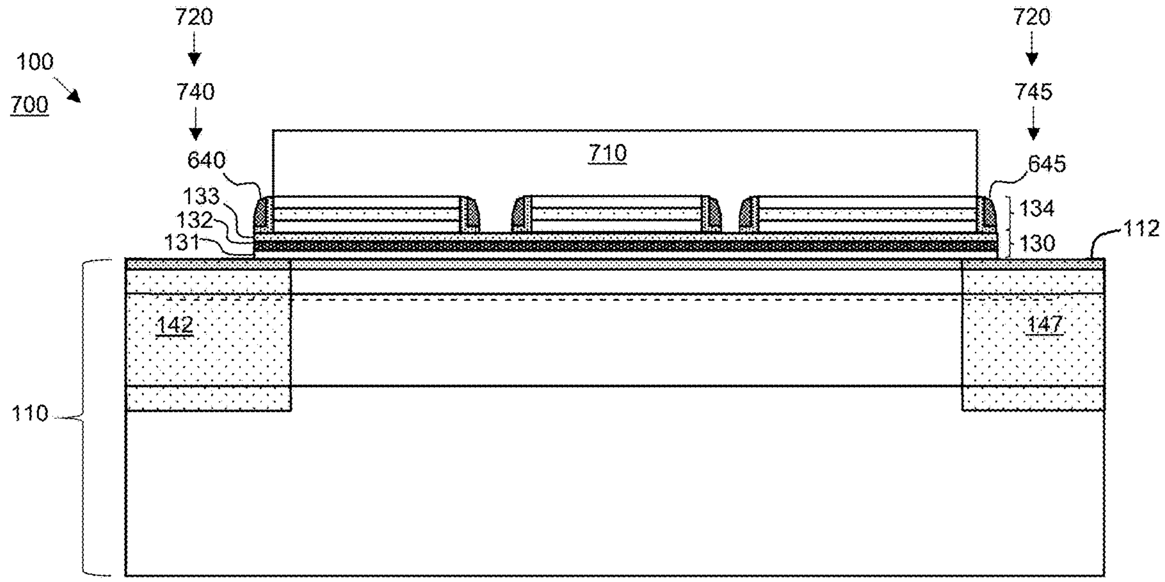

Referring now to FIGS. 1, 2, and 7, in block 212 and fabrication stage 700 (FIG. 7), a selective etch process is used to pattern and etch source and drain contact openings 740, 745 through the surface passivation 130, while stopping on the top surface 112 of the semiconductor substrate 110. More specifically, photoresist layer 710 is applied over exposed portions of the surface passivation 130, remaining portions of ILD0 134, and the dielectric spacers 640, 645, 660, 690, and the photoresist layer 710 is processed and patterned to form resist openings 720 over the source and drain regions 142, 147. According to one or more embodiments, the patterned photoresist layer 710 covers the structures between the dielectric spacers 640, 645.

The portions of surface passivation sub-layers 133, 132, 131 that are sequentially exposed through openings 720 are then sequentially etched through openings 720 to remove the exposed portions of the sub-layers 133, 132, 131. At this point, portions of the upper surface 112 of the semiconductor substrate 110 over the source and drain regions 142, 147 are exposed in the source and drain contact openings 740, 745. Multiple dry and/or wet etch technique(s) may be used sequentially to etch openings through the upper and lower surface passivation sub-layers 133, 131.

In various embodiments, the etchant used to etch the upper surface passivation sub-layer 133 (e.g., $Al_2O_3$) may selectively etch through the upper passivation sub-layer 133 and then stop on the intermediate passivation sub-layer 132. For example, the upper passivation sub-layer 133 may be dry etched using suitable techniques (e.g., RIE, ICP, or ECR) in conjunction with a chlorine based chemistry such as $Cl_2$, $CCl_4$, $BCl_3$, or other suitable dry-etch chemistries, in various embodiments. Alternatively, thermal or plasma ALE may be employed using, for example, $NbF_5$ and $CCl_4$ or $Sn(acac)_2$ and HF-pyridine. Alternatively, suitable wet-etch chemistries for etching the upper passivation sub-layer 133 include piranha etch, KOH, $NH_4OH$+, or another suitable wet-etch chemistry.

The intermediate passivation sub-layer 132 (e.g., $SiO_2$) may be etched after the etching process for the upper passivation sub-layer 133 has completed. A different etch process and/or etch chemistry may be used to etch the intermediate passivation sub-layer 132 from the etch process and/or etch chemistry that was used to etch the upper passivation sub-layer 133. For example, suitable dry etching techniques may use, for example but not by way of limitation, RIE, ICP, or ECR in conjunction a fluorine based chemistry (e.g., $SF_6$ or $CF_4$) or other suitable dry-etch chemistries, in various embodiments. Alternatively, suitable wet-etch chemistries for etching the intermediate passivation sub-layer 132 include HF or buffered HF, or another suitable wet-etch chemistry.

The lower passivation sub-layer 131 (e.g., $Si_3N_4$) may be etched after or at the same time as the etching process for the intermediate passivation sub-layer 132 is being performed, or alternatively, after the etching process for the intermediate passivation sub-layer 132 has completed. In various embodiments, the same or a different etch process and/or etch chemistry may be used to etch the lower passivation sub-layer 131 from the etch process and/or etch chemistry that was used to etch the intermediate passivation sub-layer 132. For example, suitable dry etching techniques may use, for example but not by way of limitation, one or more of a fluorine based chemistry (e.g., $SF_6$, $CF_4$) or other suitable chemistries, according to various embodiments. Alternatively, suitable wet-etch chemistries. The patterned photoresist 710 is retained for the next fabrication stage.

Figure 8:
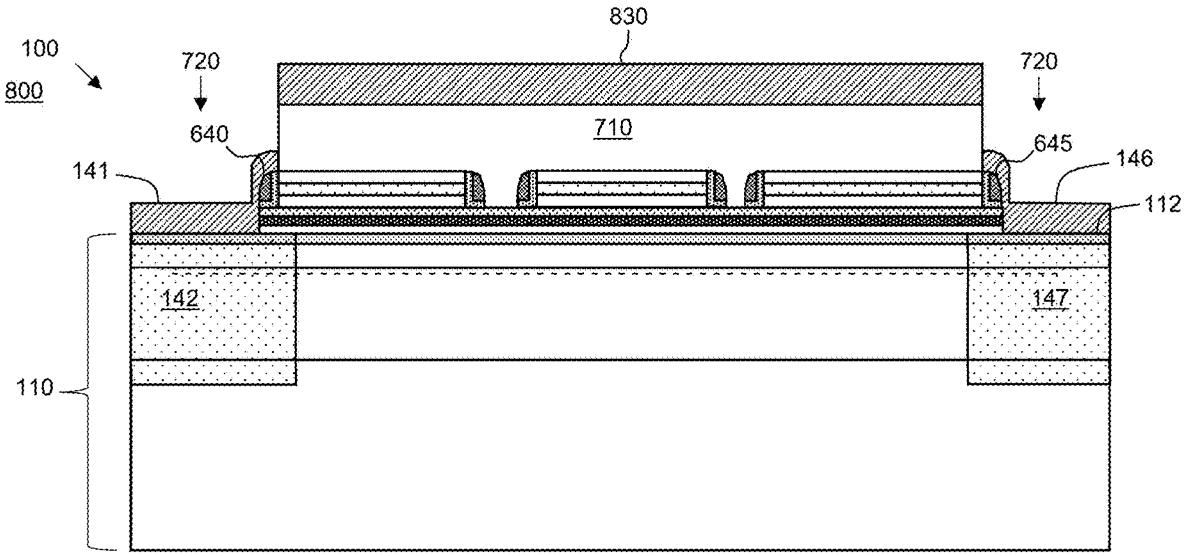

Referring now to FIGS. 1, 2, and 8, in block 214 and fabrication stage 800 (FIG. 8), conductive source and drain contacts 141, 146 are formed over the source and drain regions 142, 147 from Ohmic contact metal 830. According to one or more embodiments, the Ohmic contact metal 830 for the conducive source and drain contacts 141, 146 may be deposited using a lift-off process. More specifically, the patterned photoresist layer 710 is used as a mask to prevent the Ohmic contact metal 830 from depositing in regions other than over the source and drain regions 142, 147.

The Ohmic contact metal 830, in the form of a conductive layer or a stack of conductive layers, is deposited over the exposed portions of the source and drain regions 142, 147, the exposed source and drain dielectric spacers 640, 645, and the upper surface of the patterned photoresist layer 710. According to one or more embodiments, the Ohmic contact metal 830 may include one or more layers of titanium (Ti), titanium aluminum (TiAl), titanium tungsten (TiW), titanium-tungsten nitride (TiWN), and/or other suitable materials. In some embodiments, if desired for etch selectivity during subsequent processing steps, a thin layer of gold may be deposited on top of the conductive layer(s) to function as an etch stop during those subsequent processing steps (e.g., while performing block 226 and fabrication stage 1400, FIG. 18). The photoresist layer 710 is then removed, resulting in lift off of the portions of the Ohmic contact metal 830 that overlie the photoresist layer 710. The portions of the Ohmic contact metal 830 deposited on the source and drain regions 142, 147 and the source and drain dielectric spacers 640, 645 remain, thus forming the source and drain contacts 141, 146.

In alternate embodiments, rather than using a lift-off process to form the source and drain contacts 141, 146, a subtractive process may be used. More specifically, after fabrication stage 700 (FIG. 7), the Ohmic contact metal 830 may be deposited directly over the surface of the device, a photoresist mask (not shown) may be applied on the Ohmic contact metal 830, and patterned to cover only those portions of the Ohmic contact metal 830 that correspond to the source and drain contacts 141, 146. The portions of the Ohmic contact metal 830 that are not covered by the patterned photoresist mask may then be removed, followed by removal of the patterned photoresist mask.

Figure 9:
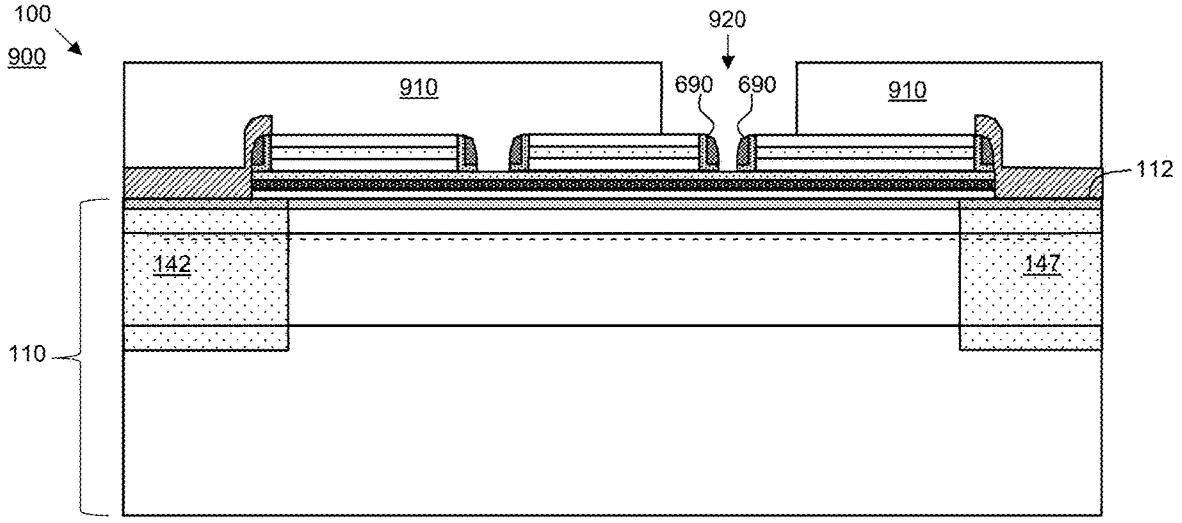

Referring now to FIGS. 1, 2, 9, and 10, in block 216 and fabrication stage 900 (FIGS. 9, 10), a multi-level field plate opening 990 is formed. Referring first to FIG. 9, in order to form the field plate opening 990, a photoresist layer 910 may be deposited over the source and drain contacts 141, 146, the upper surface of ILD0 134, and the dielectric spacers 640, 645, 660, 690. A photoresist opening 920 then may be formed over the location where the field plate opening 990 is to be formed. According to one or more embodiments, the width of the photoresist opening 920 encompasses both of the field plate dielectric spacers 690, and extends beyond those spacers 690 over portions of ILD0 134.

Figure 10:
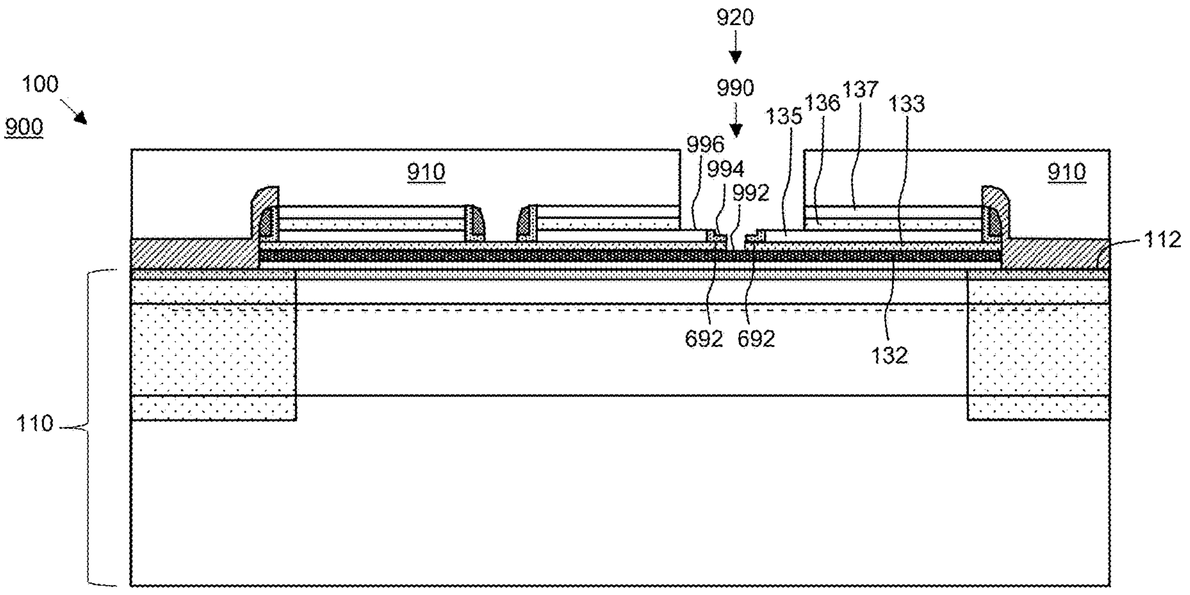
Figure 11:
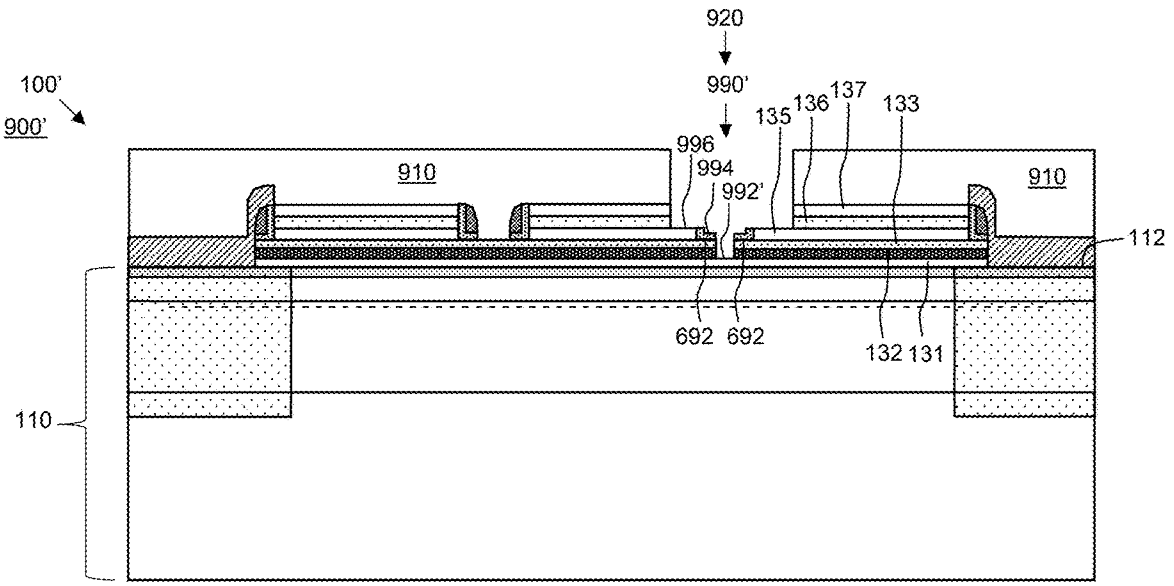

Referring now to FIG. 10, the upper and intermediate sub-layers 137, 136 of ILD0 134 and portions of the field plate dielectric spacers 690 may then be etched sequentially through the resist opening 920, while stopping on the lower ILD0 sub-layer 135 and the upper passivation sub-layer 133. Multiple etch technique(s) may be used to etch the upper and intermediate sub-layers 137, 136 of ILD0 134 and portions of the field plate dielectric spacers 690 in order to form the field plate opening 990. For example, the field plate opening 990 may be formed using RIE, ICP etching, ECR etching, or other suitable etching techniques, according to various embodiments.

According to one or more embodiments, a first etching process is performed to etch the upper ILD0 sub-layer 137, at least part of the intermediate ILD0 sub-layer 136, at least part of the upper dielectric spacer portions 693 (FIG. 6) of the field plate dielectric spacers 690, and at least part of the vertical spacer portions 691 (FIG. 6) of the field plate dielectric spacers 690. According to one or more embodiments, the etchant used to etch these features has low selectivity to the material of the upper ILD0 sub-layer 137 and the vertical spacer portions 691 (e.g., $Si_3N_4$), and also to the material of the upper dielectric spacer portion 693 (e.g., $SiO_2$). Accordingly, the etchant functions to etch the materials of the upper ILD0 sub-layer 137, the vertical spacer portions 691, the intermediate ILD0 sub-layer 136, and the upper dielectric spacer portion 693. According to an embodiment, this etching process is terminated before all of the upper dielectric spacer portion 693 and before all of the intermediate ILD0 sub-layer 136 have been removed.

To etch through the upper ILD0 sub-layer 137, at least part of the intermediate ILD0 sub-layer 136, at least part of the upper dielectric spacer portions 693 of the field plate dielectric spacers 690 (FIG. 6), and at least part of the vertical spacer portions 691 of the field plate dielectric spacers 690 (FIG. 6), suitable dry etching techniques may use, for example but not by way of limitation, one or more of $SF_6$, $CF_4$ or other suitable chemistries, according to various embodiments. In one or more embodiments, the process may include a timed etch that is designed to stop before reaching the horizontal spacer portions 692 of the field plate dielectric spacers 690.

After terminating the first etching process, a second anisotropic etching process is performed to etch any remaining portions of the intermediate ILD0 sub-layer 136 (e.g., $SiO_2$) (stopping on the lower ILD0 sub-layer 136), while also etching any remaining portions of the upper dielectric spacer portions 693 (e.g., also $SiO_2$) (stopping on the horizontal spacer portions 692 of the field plate dielectric spacers 690 (FIG. 6)). According to one or more embodiments, the remaining portions of the intermediate ILD0 sub-layer 136 and the upper dielectric spacer portions 693 may be dry etched using suitable techniques (e.g., RIE, ICP, or ECR) in conjunction with a fluorine based chemistry such as HF, $C_3F_8$, $C_2F_6$+$H_2$, $CF_4$+$H_2$, or other suitable dry-etch chemistries, in various embodiments. Alternatively, suitable wet-etch chemistries for etching the remaining portions of the intermediate ILD0 sub-layer 136 and the upper dielectric spacer portions 693 include HF, buffered HF, KOH, or another suitable wet-etch chemistry.

After terminating the second etching process, a third etching process is performed to remove the exposed portion of the upper surface passivation sub-layer 133 (e.g., $Al_2O_3$), stopping on intermediate surface passivation sub-layer 132 (e.g., $SiO_2$). According to one or more embodiments, the exposed portion of the upper surface passivation sub-layer 133 may be dry etched using suitable techniques (e.g., RIE, ICP, or ECR) in conjunction with $BCl_3$ or $C_4F_8$ chemistry, or other suitable dry-etch chemistries. In some embodiments requiring very precise etching, thermal or plasma ALE may be employed using, for example, using $NbF_5$ and $CCl_4$ or $Sn(acac)_2$ and HF-pyridine. Alternatively, suitable wet-etch chemistries for etching the exposed portion of the upper surface passivation sub-layer 133 may be used in other embodiments.

Once formed, the field plate opening 990 has a first (lowest) horizontal bottom extent 992, left and right second (intermediate) horizontal bottom extents 994, and left and right third (higher) horizontal bottom extents 996. The first horizontal bottom extent 992 is defined by the exposed surface of intermediate surface passivation sub-layer 132, and the bottom extent 992 is separated from the upper surface 112 of the semiconductor substrate 110 by a first thickness of dielectric material (e.g., the thickness of the intermediate and lower surface passivation sub-layers 132, 131). The second horizontal bottom extents 994 are defined by upper surfaces of the horizontal spacer portions 692 of the field plate dielectric spacers 690 and are separated from the upper surface 112 by thicker dielectric material (e.g., the thickness of surface passivation 130 plus the thickness of the horizontal spacer portions 692). Finally, the third horizontal bottom extents 996 are defined by upper surfaces of the lower ILD0 sub-layer 135, and are separated from the upper surface 112 by even thicker dielectric material (e.g., the thickness of surface passivation 130 and the lower ILD0 sub-layer 135). In other words, each of the bottom extents 992, 994, 996 of the field plate opening 990 has increasingly thicker underlying dielectric material (i.e., the horizontal bottom extents 992, 994, 996 become further and further from the upper surface 112 of the semiconductor substrate 110). It may be noted here that, the field plate opening 990 formed in fabrication stage 900 has a lowest horizontal bottom extent 992 that is recessed into the surface passivation 130 by approximately the thickness of the upper surface passivation sub-layer 133.

According to an alternate embodiment, in order to fabricate a second embodiment of device 100', a further etching process may be implemented to form a field plate opening 990' that is even further recessed into the surface passivation 130. More particularly, referring now to FIG. 11, one or more additional dry and/or wet etching processes are then performed to etch the portion of the intermediate surface passivation sub-layer 132, which is exposed between the horizontal spacer portions 692, while stopping on the lower surface passivation sub-layer 131. Details associated with the methods of etching through the intermediate surface passivation sub-layer 132 were discussed in detail above in conjunction with the description of fabrication stage 700, FIG. 7, and those details are intended to be incorporated herein. Basically, the etchant used to etch the intermediate passivation sub-layer 132 (e.g., $SiO_2$) may selectively etch through the intermediate passivation sub-layer 132 and then stop on the lower passivation sub-layer 131 (i.e., sub-layer 131 serves as an etch stop). For example, the intermediate passivation sub-layer 132 may be dry etched using suitable techniques (e.g., RIE, ICP, ECR, or ALE) in conjunction with a fluorine based chemistry such as $C_3F_6+H_2$ or $CF_4+H_2$, or another suitable dry-etch chemistry that favors $SiO_2$ and has a high selectivity against $Si_3N_4$. Alternatively, in some other embodiments, a suitable wet etch may be used to remove the exposed portion of intermediate surface passivation sub-layer 132.

Once formed, the field plate opening 990' has a first (lowest) horizontal bottom extent 992', left and right second (intermediate) horizontal bottom extents 994, and left and right third (higher) horizontal bottom extents 996. The first horizontal bottom extent 992' is defined by the exposed surface of the lower surface passivation sub-layer 131, and the bottom extent 992' is separated from the upper surface 112 of the semiconductor substrate 110 by a first thickness of dielectric material (e.g., the thickness of the lower surface passivation sub-layer 131). The second horizontal bottom extents 994 are defined by upper surfaces of the horizontal spacer portions 692 of the field plate dielectric spacers 690, and are separated from the upper surface 112 by thicker dielectric material (e.g., the thickness of surface passivation 130 plus the thickness of the horizontal spacer portions 692). Finally, the third horizontal bottom extents 996 are defined by upper surfaces of the lower ILD0 sub-layer 135, and are separated from the upper surface 112 by even thicker dielectric material (e.g., the thickness of surface passivation 130 and the lower ILD0 sub-layer 135). In other words, each of the bottom extents 992', 994, 996 of the field plate opening 990' has increasingly thicker underlying dielectric material (i.e., the horizontal bottom extents 992', 994, 996 become further and further from the upper surface 112 of the semiconductor substrate 110). It may be noted here that, the field plate opening 990' formed in fabrication stage 900' has a lowest horizontal bottom extent 992' that is even further recessed into the surface passivation 130 than field plate opening 990. More specifically, field plate opening 990' is recessed into the surface passivation 130 by approximately the thickness of the upper and intermediate surface passivation sub-layers 133, 132.

Figure 12:
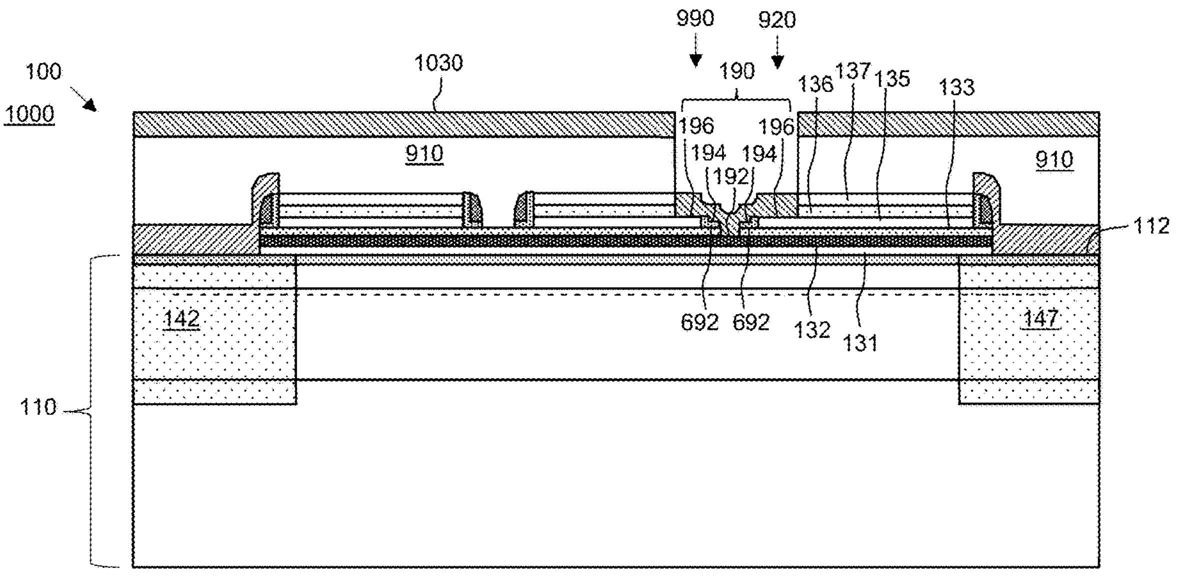
Figure 13:
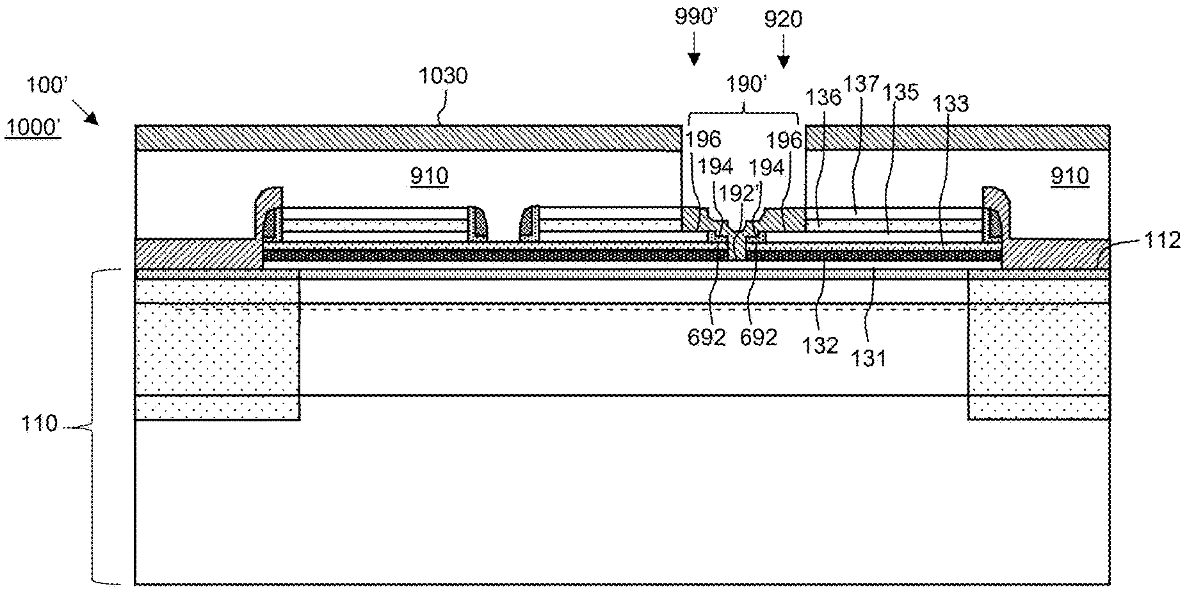

After performing only fabrication stage 900 or performing both fabrication stages 900 and 900', the patterned photoresist layer 910 may be retained for the next fabrication stage (i.e., stage 1000, FIG. 12 or 13).

Referring now to FIGS. 1, 2, and 12, in block 218 and fabrication stage 1000 (FIG. 12), for the first embodiment of device 100, a multi-step field plate 190 is then formed within the field pate opening 990 from field plate metal 1030. According to one or more embodiments, the field plate metal 1030 may be deposited using a lift-off process. More specifically, the patterned photoresist layer 910 is used as a mask to prevent the field plate metal 1030 from depositing in regions other than the location of the to-be-formed field plate 190 in a lift-off process.

The field plate metal 1030, in the form of a conductive layer or a stack of conductive layers, then may be deposited within the field plate opening 990, and on the upper surface of the remaining portions of the patterned photoresist layer 910. According to one or more embodiments, the field plate metal 1030 may include one or more layers of Ti, TiW, TiAl, TiWN, Au, Al, Mo, Ni, polysilicon, Pt. Ta, combinations of these materials, or other suitable materials. A lowest conductive layer may function as an adhesion layer. In some embodiments, if desired for etch selectivity during subsequent processing steps, a thin layer of gold may be deposited on top of the conductive layer(s) to function as an etch stop during those subsequent processing steps (e.g., while performing block 226 and fabrication stage 1400, FIG. 18). The photoresist layer 910 is then removed, resulting in lift off of the portions of the field plate metal 1030 that overlie the photoresist layer 910. The portion of the field plate metal 1030 deposited within the field plate opening remains, thus forming the conductive field plate 190.

In alternate embodiments, rather than using a lift-off process to form the conductive field plate 190, a subtractive process may be used. More specifically, after fabrication stage 900 (FIG. 10), the field plate metal 1030 may be deposited directly over the surface of the device, a photoresist mask (not shown) may be applied on the field plate metal 1030, and patterned to cover only those portions of the field plate metal 1030 that correspond to the field plate 190. The portions of the field plate metal 1030 that are not covered by the patterned photoresist mask may then be removed, followed by removal of the patterned photoresist mask.

As discussed previously, the SFP structure 190 has a stepped configuration that includes a first SFP 192 (SFP1), second SFPs 194 (SFP2), and third SFPs 196 (SFP3). The second SFPs 194 and the third SFPs 196 may be arranged substantially symmetrically (or asymmetrically) on either side of the first SFP 192. In other words, one of the second SFPs 194 is on the gate-side of the SFP structure 190, and another one of the second SFPs 194 is on the drain-side of the SFP structure 190. Similarly, one of the third SFPs 196 is on the gate-side of the SFP structure 190, and another one of the third SFPs 196 is on the drain-side of the SFP structure 190. In other words, the second SFPs 194 and the third SFPs 196 project upwardly and outwardly from SFP1 192 on both sides (i.e., the gate side and the drain side) of SFP1 192.

For SFP structure 190 (FIG. 12), the first SFP 192 has a bottom extent (e.g., bottom extent 992, FIG. 10) that is separated from the upper surface 112 of the semiconductor substrate 110 by a first thickness of dielectric material (e.g., the thickness of the lower and intermediate surface passivation sub-layers 131, 132). Essentially, SFP1 192 is recessed below the upper surface of the surface passivation 130 by the thickness of the upper surface passivation sub-layer 133. The second SFPs 194 have bottom extents (e.g., bottom extents 994, FIG. 10) that are separated from the upper surface 112 by thicker dielectric material (e.g., the thickness of surface passivation 130 plus the thickness of the horizontal spacer portions 692). More specifically, the horizontal bottom extents of the second SFPs 194 overlie and contact upper surfaces of the horizontal spacer portions 692, whereas the first SFP 192 contacts sidewalls of the horizontal spacer portions 692. Finally, the third SFPs 196 have bottom extents (e.g., bottom extents 996, FIG. 10) that are separated from the upper surface 112 by even thicker dielectric material (e.g., the thickness of surface passivation 130 and the lower ILD0 sub-layer 135). In other words, each of the bottom extents of the SFPs 192, 194, 196 has increasingly thicker underlying dielectric material (i.e., the horizontal bottom extents 992, 994, 996 become further and further from the upper surface 112 of the semiconductor substrate 110). As mentioned previously, the second and third SFPs 194, 196, each with increasingly thicker underlying dielectric material (i.e., higher and higher horizontal bottom extents), are provided to relieve the electric field at the edge of the first SFP 192, so as to ensure dielectric reliability and high break-down voltage.

Referring now to FIGS. 1, 2, and 13, in an alternate embodiment of block 218 and fabrication stage 1000 (FIG. 12), for the second embodiment of device 100', a multi-step field plate 190' is formed within the field pate opening 990' from field plate metal 1030 in fabrication stage 1000'. Details associated with the composition of the field plate metal 1030 and methods of depositing the field plate metal 1030 were discussed in detail above in conjunction with the description of fabrication stage 1000, FIG. 12, and those details are intended to be incorporated here. Briefly, using a lift-off process, the field plate metal 1030 for field plate 190' may be deposited on the surface of a patterned photoresist layer 910, and through openings 920 in the photoresist layer 910, and the photoresist layer 910 may then be removed. Alternatively, rather than using a lift-off process to form field plate 190', a subtractive process may be used. Either way, the field plate metal 1030 may include one or more layers of Ti, TiW, TiAl, TiWN, Au, Al, Mo, Ni, polysilicon, Pt, Ta, combinations of these materials, or other suitable materials. The portion of the field plate metal 1030 deposited within the field plate opening 990' remains, thus forming the conductive field plate 190'.

Again, in this second embodiment, the SFP structure 190' has a stepped configuration that includes a first SFP 192' (SFP1), second SFPs 194 (SFP2), and third SFPs 196 (SFP3). The second SFPs 194 and the third SFPs 196 are arranged substantially symmetrically on either side of SFP1 192'. SFP1 192' has a bottom extent (e.g., bottom extent 992', FIG. 11) that is separated from the upper surface 112 of the semiconductor substrate 110 by a first thickness of dielectric material (e.g., the thickness of the lower surface passivation sub-layer 131). Essentially, SFP1 192' is recessed below the upper surface of the surface passivation 130 by an even greater depth than SFP1 192 (FIG. 12) described in conjunction with the first embodiment of device 100. In device 100', the second SFPs 194 have bottom extents (e.g., bottom extents 994, FIG. 11) that are separated from the upper surface 112 by thicker dielectric material (e.g., the thickness of surface passivation 130 plus the thickness of the horizontal spacer portions 692). Finally, the third SFPs 196 have bottom extents (e.g., bottom extents 996, FIG. 11) that are separated from the upper surface 112 by even thicker dielectric material (e.g., the thickness of surface passivation 130 and the lower ILD0 sub-layer 135). In other words, each of the bottom extents of the SFPs 192', 194, 196 has increasingly thicker underlying dielectric material (i.e., the horizontal bottom extents 992', 994, 996 become further and further from the upper surface 112 of the semiconductor substrate 110). As mentioned previously, the second and third SFPs 194, 196, each with increasingly thicker underlying dielectric material (i.e., higher and higher horizontal bottom extents), are provided to relieve the electric field at the edge of SFP1 192', so as to ensure dielectric reliability and high break-down voltage.

It should be noted here that the following fabrication stages 1100, 1200, 1300, and 1400 are the same for the first and second embodiments of device 100, 100'. For brevity, these fabrication stages will be shown only for the first embodiment of device 100. The completed versions of both the first and second embodiments of device 100, 100' will be shown in FIGS. 19 and 20.

Figure 14:
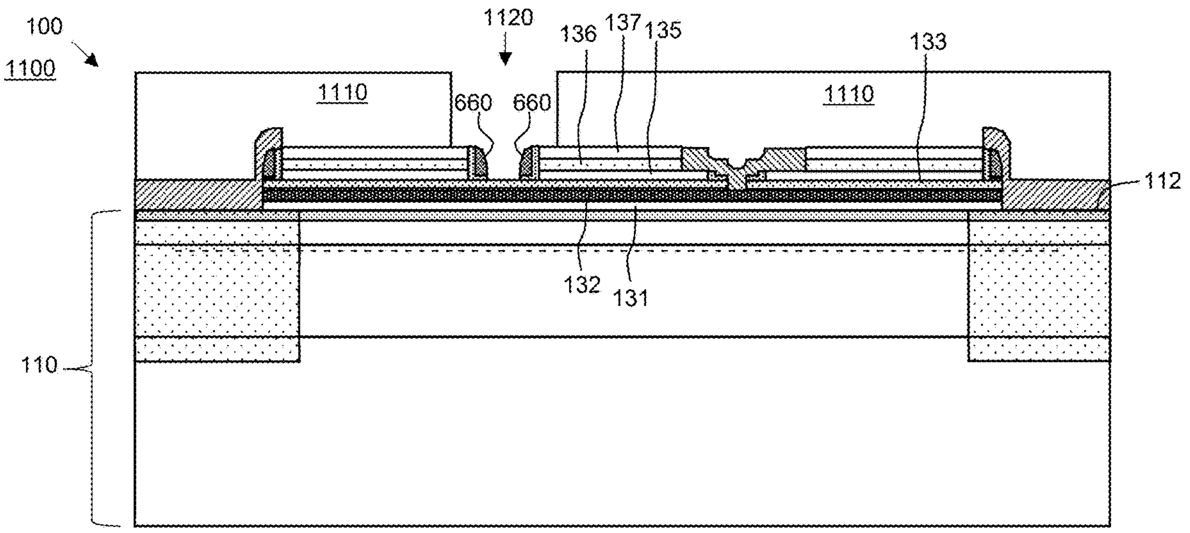

Referring now to FIGS. 1, 2, 14, and 15, in block 220 and fabrication stage 1100 (FIGS. 14, 15), a multi-level gate electrode opening 1160 is formed. Referring first to FIG. 14, in order to form the gate electrode opening 1160, a photoresist layer 1110 may be deposited over the source and drain contacts 141, 146, the upper surface of ILD0 134, and the dielectric spacers 660, and a photoresist opening 1120 may be formed over the location where the gate electrode opening 1160 is to be formed. According to one or more embodiments, the width of the photoresist opening 1120 encompasses both of the gate dielectric spacers 660, and extends beyond those spacers 660 over portions of ILD0 134.

Figure 15:
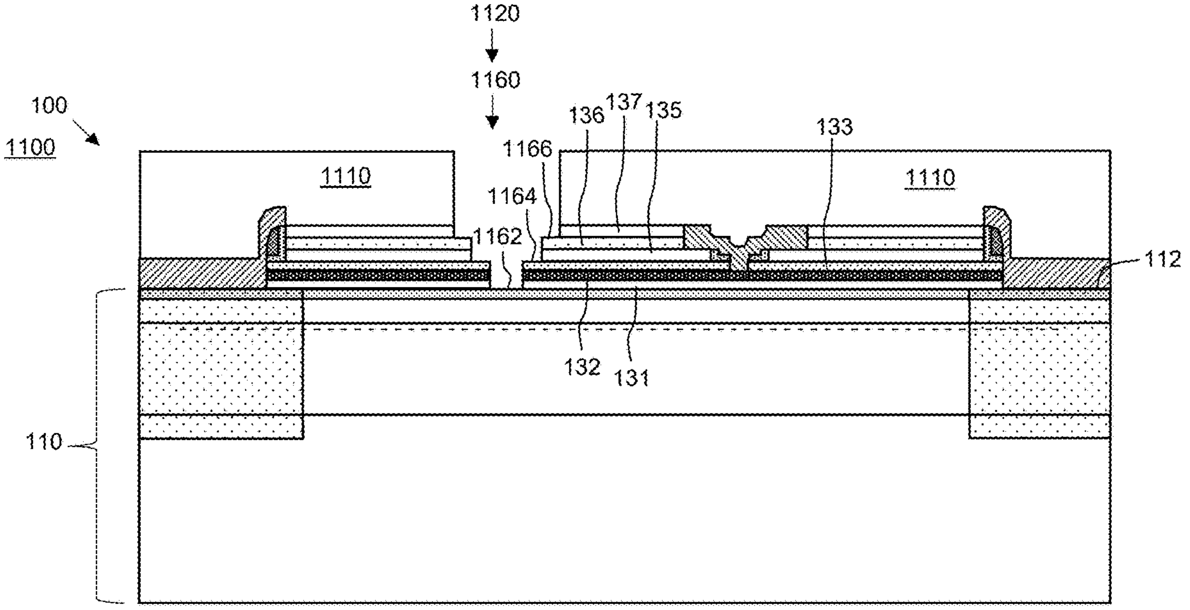

Referring now to FIG. 15, to form the gate electrode opening 1160, various features and layers are removed through the resist opening 1120. More specifically, several etching processes may be performed to remove the gate dielectric spacers 660 and the portion of the surface passivation 130 that is exposed between the gate dielectric spacers 660. A portion of the upper sub-layer 137 of ILD0 134 that is exposed through resist opening 1120 also may be removed in the process.

According to one or more embodiments, one or more first etching processes are performed to remove the portion of the upper surface passivation sub-layer 133 (e.g., $Al_2O_3$) that is exposed between the gate dielectric spacers 660. Multiple dry and/or wet etch technique(s) may be used to etch these features. For example, these features may be etched using RIE, ICP etching, ECR etching, and wet chemical etching, according to various embodiments.

According to one or more embodiments, a plasma etch may first be used with an etchant that selectively removes the material of the upper surface passivation sub-layer 133 with selectivity against the material of dielectric spacers 660 and against the material of exposed portions of the ILD0 sub-layer 137. Some loss of these materials can be tolerated. Suitable dry etching techniques may use, for example but not by way of limitation, one or more of a fluorine based chemistry such as $C_4F_8$, a chlorine based chemistry such as $BCl_3$, or another suitable dry-etch chemistry, according to various embodiments. Desirably, the etchant may completely remove the exposed portion of the upper surface passivation sub-layer 133. Alternatively, some embodiments may employ ALE or plasma ALE. After exposing the intermediate passivation sub-layer 132 (e.g. $SiO_2$) between the gate dielectric spacers 660, the exposed portions of the intermediate passivation sub-layer 132 can be removed during the same process that is used to remove the upper spacer portions 693 (e.g. also $SiO_2$) using a suitable dry or wet etch chemistry (e.g., HF plasma or an HF based wet etch for $SiO_2$).

These etching process(es) result in the complete removal of the upper dielectric spacer portion 693 of the gate dielectric spacers 660, leaving the vertical and horizontal spacer portions 691, 692 (FIG. 6) of the gate dielectric spacers 660 essentially intact. In addition, the first etching process(es) result in the complete removal of portions of the upper and intermediate surface passivation sub-layers 133, 132 that were exposed between the gate dielectric spacers 660, so that a portion of the lower surface passivation sub-layer 131 is exposed between the horizontal spacer portions 692.

An additional etching process then may be performed to etch the portion of the lower surface passivation sub-layer 131 (e.g., $Si_3N_4$) that is exposed between the horizontal spacer portions 692, while stopping on the upper surface 112 of the substrate 110. The additional etching process also may be configured to remove the vertical and horizontal spacer portions 691, 692 (e.g., also $Si_3N_4$), and all or part of the exposed portions of the upper ILD0 sub-layer 137 (e.g., also $Si_3N_4$), but should be configured to stop on the intermediate ILD0 sub-layer 136. Some portion of the upper ILD0 sub-layer 137 may remain. To etch the exposed portion of the lower surface passivation sub-layer 131, the vertical and horizontal spacer portions 691, 692, and the exposed portions of the upper ILD0 sub-layer 137, RIE, ICP etching, ECR etching, and/or wet chemical etching may be used. Suitable dry etching techniques may use, for example but not by way of limitation, one or more of $SF_6+O_2$, $CF_4+O_2$, $NF_3+N_2+O_2+H_2$ or other suitable chemistries. Suitable wet-etch chemistries include, for example but not by way of limitation, HF, buffered HF, or other suitable wet etchant(s).

Once formed, the gate electrode opening 1160 has a first (lowest) horizontal bottom extent 1162, left and right second (intermediate) horizontal bottom extents 1164, and left and right third (higher) horizontal bottom extents 1166. The first horizontal bottom extent 1162 is defined by the exposed portion of the upper surface 112 of the semiconductor substrate 110. The second horizontal bottom extents 1164 are defined by surfaces of the upper surface passivation sub-layer 133, and are separated from the upper surface 112 by a first thickness of dielectric material (e.g., the thickness of surface passivation 130). Finally, the third horizontal bottom extents 1166 are defined by surfaces of the intermediate ILD0 sub-layer 136, and are separated from the upper surface 112 by thicker dielectric material (e.g., the thickness of surface passivation 130, the lower ILD0 sub-layer 135, the intermediate ILD0 sub-layer 136, and possibly remaining portions of the upper ILD0 sub-layer 137). In other words, each of the bottom extents 1164, 1166 of the gate electrode opening 1160 has increasingly thicker underlying dielectric material (i.e., the horizontal bottom extents 1164, 1166 become further and further from the upper surface 112 of the semiconductor substrate 110). The patterned photoresist layer 1110 may be retained for the next fabrication stage (i.e., stage 1200, FIG. 16).

Referring now to FIGS. 1, 2, and 16, in block 222 and fabrication stage 1200 (FIG. 16), a multi-step gate electrode 160 is then formed. According to one or more embodiments, a lift-off resist process may be used to form the gate electrode 160. The previously deposited and patterned photoresist layer 1110 may be utilized for this process. A gate metal layer 1210 is deposited over the photoresist layer 1110 and into the gate electrode opening 1160. In one or more embodiments, the various layers of the gate metal layer 1210 may be deposited by evaporation, sputtering, PVD, ALD, or other suitable deposition technique(s).

The conductive layer(s) of the gate metal layer 1210 may include Au, Ag. Al, Cu, Ti, Ni, Pt and/or other substantially conductive materials. Essentially, a Schottky contact is formed in the gate channel (i.e., the portion of the gate electrode 160 closest to the upper surface 112 of the semiconductor substrate 110). The conductive layer(s) of the gate metal layer 1210 may be between about 1000 and about 20,000 angstroms in thickness, although other thickness values may be used. According to one or more embodiments, the thickness of the gate metal layer 1210 is greater than the cumulative thickness of surface passivation 130 and ILD0 134.

Once the gate metal layer 1210 is deposited, a lift-off process is then performed to remove the photoresist layer 1110 and the portions of the gate metal layer 1210 deposited on the photoresist layer 1110, while leaving the portion of the gate metal layer 1210 deposited into the gate electrode opening 1160 intact.

In alternate embodiments, rather than using a lift-off process to form the gate electrode 160, a subtractive process may be used. More specifically, after fabrication stage 1100 (FIG. 15), the gate metal layer 1210 may be deposited directly over the surface of the device, a photoresist mask (not shown) may be applied on the gate metal layer 1210, and patterned to cover only those portions of the gate metal layer 1210 that correspond to the gate electrode 160. The portions of the gate metal layer 1210 that are not covered by the patterned photoresist mask may then be removed, followed by removal of the patterned photoresist mask.

As discussed previously, the gate electrode 160 has a stepped configuration that includes a the gate channel portion 162, and first and second GFPs 164, 166 that are arranged substantially symmetrically (or asymmetrically) on either side of the gate channel portion 162. In other words, one of the first GFPs 164 is on the drain-side of the gate electrode 160, and another one of the first GFPs 164 is on the source-side of the gate electrode 160. Similarly, one of the second GFPs 166 is on the drain-side of the gate electrode 160, and another one of the second GFPs 166 is on the source-side of the gate electrode 160. In other words, the first GFPs 164 and the second GFPs 166 project upwardly and outwardly from the gate channel portion 162 on both sides (i.e., the source side and the drain side) of the gate electrode 160.

The gate channel portion 162 is located at the gate channel, and has a horizontal bottom extent that defines the lowest portion of the gate electrode 160 (i.e., the portion contacting or closest to the upper substrate surface 112). The first GFP 164 (GFP1) is integrally-formed with the gate channel portion 162, and has a horizontal bottom extent that is higher than the bottom extent of the gate channel portion 162. More specifically, GFP1 164 overlies and contacts the upper surface of the surface passivation sub-layer 133. The second GFP 166 (GFP2) also is integrally-formed with the gate channel portion 162, and has a horizontal bottom extent that is higher than the bottom extents of both the gate channel portion 162 and GFP1 164. More specifically, GFP2 166 overlies and contacts the upper surface of the intermediate ILD0 sub-layer 136. As can be seen in FIG. 16, the gate electrode 160 has a relatively large cross-sectional area, which may result in a relatively-low gate resistance, $R_G$, without incurring a significant increase in the gate-drain capacitance, $C_{GD}$, or the gate-source capacitance, $C_{GS}$.

It may be noted here that, in one or more embodiments, the bottom extent of SFP1 192 (or SFP1 192') are recessed with respect to the bottom extent of GFP1 164 (i.e., SFP1 192 (and SFP1 192') have thinner underlying dielectric than the dielectric underlying GFP1 164). Further, the bottom extents of SFP1 192 (or SFP 192'), SFP2 194, and SFP3 196 all may be recessed with respect to the bottom extent of GFP2 166 (i.e., SFP1 192, SFP2 194, and SFP3 196 all have thinner underlying dielectric than the dielectric underlying GFP2 166). This may result in a reduction of $C_{GD}$. The lower gate drain capacitance, $C_{GD}$, in turn, may result in increased gain for the device 100 (or device 100').

Figure 17:
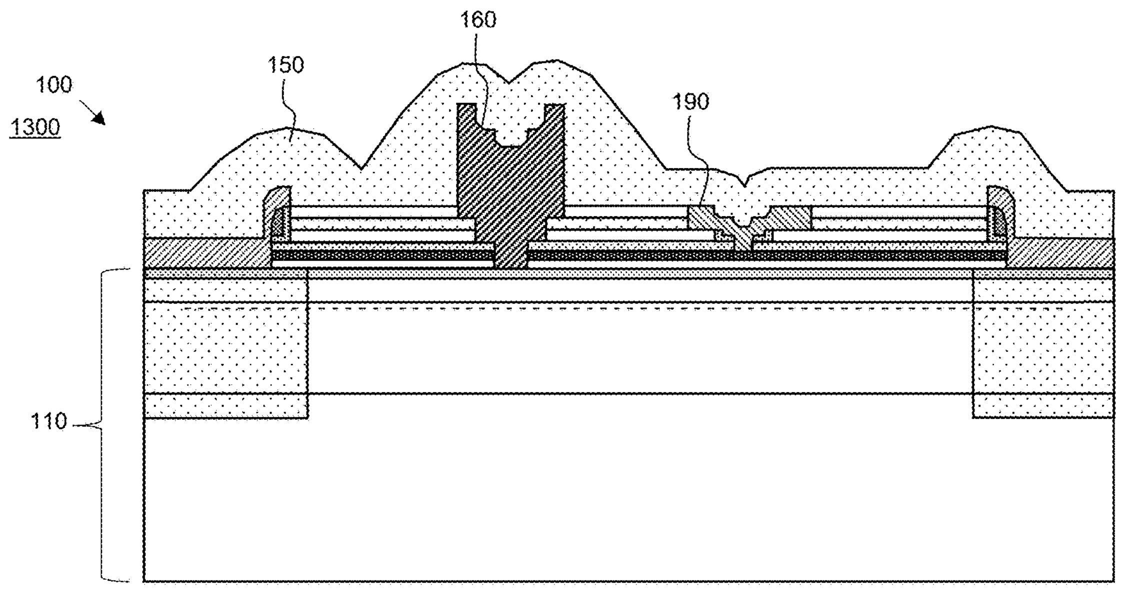

Referring now to FIGS. 1, 2, and 17, in block 224 and fabrication stage 1300 (FIG. 17, a second inter-layer dielectric (ILD1) 150 is deposited over ILD0 134, the gate electrode 160, and the field plate 190 (or 190'). In various embodiments, the dielectric material used for the ILD1 150 may be the same or different from the dielectric materials used for ILD0 134. Preferably, the dielectric material used for ILD1 150 is a low-k dielectric material that is different from the material of the ILD0 top sub-layer 137 in order to provide etch selectivity. For example, the material for ILD1 150 may be selected from $SiO_2$, organo-silicate glass, porous $SiO_2$, $Si_3N_4$, SiON, $HfO_2$, $Al_2O_3$ or AlN, and other suitable materials. ILD1 150 may be formed using one or more of LPCVD, ALD, sputtering, PVD, PECVD, MOCVD, MBE, ICP deposition, ECR deposition, or other suitable techniques. In various embodiments, ILD1 150 may have a thickness in a range of about 0.2 microns to about 2.0 microns, although ILD1 150 may be thinner or thicker, as well.

Referring now to FIGS. 1, 2, and 18, in block 226 and fabrication stage 1400 (FIG. 18), a selective etch process is used to form an opening 1490 through ILD1 150, in order to expose the field plate 190 (or 190'). Simultaneously, openings through ILD1 150 also are formed to expose the source and drain Ohmic contacts 141, 146, although those openings are not shown in FIG. 18, as they are further to the left and right, respectively, of the portion of device 100 shown in FIG. 18. See FIG. 1 for the locations of the openings through ILD1 150 to the source and drain Ohmic contacts 141, 146.

To form the field plate opening 1490, photoresist layer 1410 is applied over ILD1 150, and the photoresist layer 1410 is processed and patterned to form a photoresist opening 1420 that has a first side 1421 aligned along the width of the field plate 190 (or 190'), and a second side 1422 aligned over a point along ILD0 134 to the right of the rightmost edge of the field plate 190 (or 190'). Additionally, source and drain openings (see FIG. 1) are formed through the photoresist layer 1410 over the source and drain contacts 141, 146.

The portion of ILD1 150 that is exposed through opening 1420 is then etched through opening 1420 to remove the exposed portion of ILD1 150. The etching process continues until the field plate 190 (or 190') is fully exposed, and a portion 1434 of the upper surface of ILD0 134 is reached (i.e., the etching process stops on the upper surface of ILD0 134). This process results in an unfilled field plate opening 1490 over the field plate 190. The bottom extent of the field plate opening 1490 is defined by the upper surface of the field plate 190 (or 190') and the exposed portion 1434 of ILD0 134.

Multiple dry and/or wet etch technique(s) may be used to etch openings through ILD1 150. For example, ILD1 150 may be etched using RIE, ICP etching, ECR etching, and wet chemical etching, according to various embodiments.

Referring now to FIGS. 1, 2, 19, and 20, in block 228 and fabrication stage 1500 (FIG. 19) and 1500' (FIG. 20), the photoresist 1410 (FIG. 18) is removed, and metallization is deposited over ILD1 150 (and into source, drain, and field plate openings through ILD1 150) to form the source electrode 140 (FIG. 1), the drain electrode 145 (FIG. 1), source metallization 148 (FIG. 1), and drain metallization 149 (FIG. 1). It should be noted here that FIG. 19 corresponds to the first embodiment of device 100 that includes a first embodiment of field plate 190, and FIG. 20 corresponds to the second embodiment of device 100' that includes a second embodiment of field plate 190'.

In either embodiment of device 100 or 100', within the field plate opening 1490 (FIG. 18), the source metallization 148 is deposited to contact the field plate 190 (FIG. 19) or the field plate 190' (FIG. 20), and extends over ILD1 150 to the source contact 141, to provide a conductive field plate-to-source connection. In addition, the source metallization 148 contacts the portion 1434 (FIG. 18) of the upper surface of ILD0 134, which establishes a fourth source-connected field plate, SFP4 198, that has a horizontal bottom extent that extends beyond the right edge of the field plate 190 or 190'. According to one or more embodiments, SFP4 198 is separated from the upper surface 112 of the semiconductor substrate 110 by even thicker dielectric (e.g., the cumulative thickness of surface passivation 130 and ILD0 134) than the dielectric underlying the other field plates (SFP1 192, SFP2 194, SFP3 196). Further, SFP4 198 is higher than GFP2 166 (i.e., SFP4 198 has thicker underlying dielectric than GFP2 166). Further still, the source metallization 148 contacts the upper surface of ILD1 150, which establishes a fifth source-connected field plate, SFP5 199, that has a horizontal bottom extent that extends beyond the right edge of the field plate 190 or 190'. According to one or more embodiments, SFP5 199 is separated from the upper surface 112 of the semiconductor substrate 110 by even thicker dielectric (e.g., the cumulative thickness of surface passivation 130, ILD0 134, and ILD1 150. This higher SFP5 199 may be particularly beneficial for high voltage devices.

For example, the metallization used to form the source electrode 140 (FIG. 1), the drain electrode 145 (FIG. 1), and the source and drain metallization 148, 149 (FIG. 1) may be blanket deposited and etched, or may be deposited using a lift-off process. More specifically, a patterned, multi-layer conductive stack may be formed over ILD1 150. The conductive stack may include one or more metal layers and/or other suitable materials, according to various embodiments. In some embodiments, a first layer within the multi-layer stack may include an adhesion layer (e.g., TiW or another suitable material), and additional layers may include gold (Au) and other suitable metals.

Referring again to FIG. 1, in block 230, the device 100 or 100' may be completed by depositing the final passivation layers 170 and 180 (FIG. 1). For example, passivation layer 170 may be formed from $Si_3N_4$ or another suitable material, and passivation layer 180 may be formed from polybenzoxazoles (PBO) or another suitable material. Passivation layers 170, 180 may be deposited, for example, using one or more of LPCVD, ALD, sputtering, PVD, PECVD, MOCVD, MBE, ICP deposition, ECR deposition, or other suitable techniques. Additional patterned conductive layers and dielectric layers may be formed over passivation layers 170, 180, openings may be made through each of the dielectric layers, and one or more intervening patterned conductive layers may be formed to provide for electrical connectivity with other device elements.

An embodiment of a semiconductor device includes a semiconductor substrate with an upper surface and a channel, and source and drain electrodes over the upper surface of the semiconductor substrate. The source and drain electrodes are electrically coupled to the channel, and the channel extends between the source and drain electrodes. The device also includes surface passivation over the upper surface of the semiconductor substrate between the source and drain electrodes, and a first interlayer dielectric (ILD0) over an upper surface of the surface passivation. A gate electrode is included over the upper surface of the semiconductor substrate between the source and drain electrodes. The gate electrode includes a gate channel portion that extends through the surface passivation to contact the upper surface of the semiconductor substrate, a first gate field plate with a first horizontal bottom extent that overlies and contacts the upper surface of the surface passivation, and a second gate field plate with a second horizontal bottom extent that is higher than the first horizontal bottom extent. A conductive field plate is included over the upper surface of the semiconductor substrate between the gate electrode and the drain electrode. The conductive field plate includes a first field plate with a third horizontal bottom extent that is recessed below the upper surface of the surface passivation, and a second field plate with a fourth horizontal bottom extent that is higher than the first horizontal bottom extent of the first gate field plate.

According to a further embodiment, the surface passivation includes a lower surface passivation sub-layer formed on the upper surface of the semiconductor substrate, an intermediate surface passivation sub-layer formed on the lower surface passivation sub-layer, and an upper surface passivation sub-layer formed on the intermediate surface passivation sub-layer and defining an upper surface of the surface passivation. The third horizontal bottom extent of the first field plate is recessed below the upper surface of the surface passivation.

According to another further embodiment, the first gate field plate and the second gate field plate project upwardly and outwardly from the gate channel portion, and the second field plate and the third field plate project upwardly and outwardly from the first field plate.

According to yet another further embodiment, the first gate field plate and the second gate field plate are located on a drain side of the gate electrode, and the gate electrode further includes another first gate field plate and another second gate field plate located on a source side of the gate electrode. Further, the second field plate and the third field plate are located on a gate side of the conductive field plate, and the conductive field plate further includes another second field plate and another third field plate on a drain side of the conductive field plate.

An embodiment of a method of fabricating a semiconductor device includes providing a semiconductor substrate with an upper surface and a channel, forming surface passivation over the upper surface of the semiconductor substrate, forming a first interlayer dielectric (ILD0) over an upper surface of the surface passivation, and forming source and drain electrodes over the upper surface of the semiconductor substrate, wherein the source and drain electrodes are electrically coupled to the channel, and the channel extends between the source and drain electrodes. The method further includes forming a gate electrode over the upper surface of the semiconductor substrate between the source and drain electrodes. The gate electrode includes a gate channel portion that extends through the surface passivation to contact the upper surface of the semiconductor substrate, a first gate field plate with a first horizontal bottom extent that overlies and contacts the upper surface of the surface passivation, and a second gate field plate with a second horizontal bottom extent that is higher than the first horizontal bottom extent. The method further includes forming a conductive field plate over the upper surface of the semiconductor substrate between the gate electrode and the drain electrode. The conductive field plate includes a first field plate with a third horizontal bottom extent that is recessed below the upper surface of the surface passivation, and a second field plate with a fourth horizontal bottom extent that is higher than the first horizontal bottom extent of the first gate field plate.

According to a further embodiment, forming the surface passivation includes forming a lower surface passivation sub-layer on the upper surface of the semiconductor substrate, forming an intermediate surface passivation sub-layer on the lower surface passivation sub-layer, and forming an upper surface passivation sub-layer on the intermediate surface passivation sub-layer, where an upper surface of the upper surface passivation sub-layer defines an upper surface of the surface passivation.

According to another further embodiment, the method also includes simultaneously forming a gate electrode opening and a field plate opening through the ILD0, and forming field plate dielectric spacers in the field plate opening on sidewalls of the ILD0. The field plate dielectric spacers include vertical spacer portions that contact the sidewalls of the ILD0, horizontal spacer portions that contact the upper surface of the surface passivation, and upper dielectric spacer portions that overlie and contact the vertical and horizontal spacer portions. The method also includes removing the upper surface passivation sub-layer between the field plate dielectric spacers to expose a portion of an upper surface of the intermediate surface passivation sub-layer, and removing the upper dielectric spacer portions and the vertical spacer portions of the field plate dielectric spacers. Forming the conductive field plate includes forming the first field plate on the portion of the upper surface of the intermediate surface passivation sub-layer between the vertical spacer portions, and forming the second field plate on the vertical spacer portions.

According to yet another further embodiment, the method also includes simultaneously forming a gate electrode opening and a field plate opening through the ILD0, and forming field plate dielectric spacers in the field plate opening on sidewalls of the ILD0. The field plate dielectric spacers include vertical spacer portions that contact the sidewalls of the ILD0, horizontal spacer portions that contact the upper surface of the surface passivation, and upper dielectric spacer portions that overlie and contact the vertical and horizontal spacer portions. The method also includes removing the upper surface passivation sub-layer and the intermediate surface passivation sub-layer between the field plate dielectric spacers to expose a portion of an upper surface of the lower surface passivation sub-layer, and removing the upper dielectric spacer portions and the vertical spacer portions of the field plate dielectric spacers. Forming the conductive field plate includes forming the first field plate on the portion of the upper surface of the lower surface passivation sub-layer between the vertical spacer portions, and forming the second field plate on the vertical spacer portions.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:

a semiconductor substrate with an upper surface and a channel;

source and drain electrodes over the upper surface of the semiconductor substrate, wherein the source and drain electrodes are electrically coupled to the channel, and the channel extends between the source and drain electrodes;

surface passivation over the upper surface of the semiconductor substrate between the source and drain electrodes;

a first interlayer dielectric (ILD0) over an upper surface of the surface passivation;

a gate electrode over the upper surface of the semiconductor substrate between the source and drain electrodes, wherein the gate electrode includes a gate channel portion that extends through the surface passivation to contact the upper surface of the semiconductor substrate, a first gate field plate with a first horizontal bottom extent that overlies and contacts the upper surface of the surface passivation, and a second gate field plate with a second horizontal bottom extent that is higher than the first horizontal bottom extent; and a conductive field plate over the upper surface of the semiconductor substrate between the gate electrode and the drain electrode, wherein the conductive field plate includes a first field plate with a third horizontal bottom extent that is recessed below the upper surface of the surface passivation, and a second field plate with a fourth horizontal bottom extent that is higher than the first horizontal bottom extent of the first gate field plate.

2. The semiconductor device of claim 1, further comprising:

a horizontal dielectric spacer portion on an upper surface of the surface passivation, wherein the fourth horizontal bottom extent of the second field plate overlies and contacts an upper surface of the horizontal dielectric spacer portion.

3. The semiconductor device of claim 1, wherein:

the surface passivation includes a lower surface passivation sub-layer formed on the upper surface of the semiconductor substrate, an intermediate surface passivation sub-layer formed on the lower surface passivation sub-layer, and an upper surface passivation sub-layer formed on the intermediate surface passivation sub-layer and defining an upper surface of the surface passivation.

4. The semiconductor device of claim 3, wherein:

the lower surface passivation sub-layer is formed from silicon nitride;

the intermediate surface passivation sub-layer is formed from silicon dioxide; and the upper surface passivation sub-layer is formed from a material selected from aluminum oxide, aluminum nitride, and hafnium oxide.

5. The semiconductor device of claim 3, wherein:

the third horizontal bottom extent of the first field plate contacts an upper surface of the intermediate surface passivation sub-layer.

6. The semiconductor device of claim 3, wherein:

the third horizontal bottom extent of the first field plate contacts an upper surface of the lower surface passivation sub-layer.

7. The semiconductor device of claim 1, wherein: the conductive field plate further includes a third field plate with a fifth horizontal bottom extent that is higher than the fourth horizontal bottom extent of the second field plate.

8. The semiconductor device of claim 7, wherein: the ILD0 includes a lower ILD0 sub-layer on the upper surface of the surface passivation, and an intermediate ILD0 sub-layer on an upper surface of the lower ILD0 sub-layer; the fifth horizontal bottom extent of the third field plate overlies and contacts the upper surface of the lower ILD0 sub-layer; and the second horizontal bottom extent of the second gate field plate overlies an upper surface of the intermediate ILD0 sub-layer.

9. The semiconductor device of claim 8, wherein: the ILD0 further includes an upper ILD0 sub-layer on the upper surface of the intermediate ILD0 sub-layer; and the conductive field plate further includes a fourth field plate with a sixth horizontal bottom extent that is higher than the fifth horizontal bottom extent of the third field plate, and the sixth horizontal bottom extent of the fourth field plate overlies and contacts an upper surface of the upper ILD0 sub-layer.

10. The semiconductor device of claim 9, wherein: the lower ILD0 sub-layer is formed from a material selected from silicon nitride; the intermediate ILD0 sub-layer is formed from a material selected from silicon dioxide; and the upper ILD0 sub-layer is formed from a material selected from silicon nitride.

11. The semiconductor device of claim 8, wherein: the first gate field plate and the second gate field plate project upwardly and outwardly from the gate channel portion; and the second field plate and the third field plate project upwardly and outwardly from the first field plate.

12. The semiconductor device of claim 11, wherein: the first gate field plate and the second gate field plate are located on a drain side of the gate electrode; the gate electrode further includes another first gate field plate and another second gate field plate located on a source side of the gate electrode; the second field plate and the third field plate are located on a gate side of the conductive field plate; and the conductive field plate further includes another second field plate and another third field plate on a drain side of the conductive field plate.

13. The semiconductor device of claim 1, wherein: the first field plate and the second field plate are formed from a field plate metal; and the semiconductor device further comprises a source metallization that extends from the field plate metal over the gate electrode to a source contact.

14. The semiconductor device of claim 13, wherein: the field plate metal includes one or more materials selected from titanium, titanium tungsten, titanium aluminum, titanium tungsten nitride, gold, aluminum, molybdenum, nickel, polysilicon, platinum, copper, and tantalum; and the source metallization includes one or more materials selected from titanium, titanium tungsten, titanium aluminum, titanium tungsten nitride, gold, titanium-aluminum-gold, aluminum, molybdenum, nickel, polysilicon, germanium, platinum, copper, and tantalum.

15. A method of fabricating a semiconductor device, the method comprising: providing a semiconductor substrate with an upper surface and a channel; forming surface passivation over the upper surface of the semiconductor substrate; forming a first interlayer dielectric (ILD0) over an upper surface of the surface passivation; forming source and drain electrodes over the upper surface of the semiconductor substrate, wherein the source and drain electrodes are electrically coupled to the channel, and the channel extends between the source and drain electrodes; forming a gate electrode over the upper surface of the semiconductor substrate between the source and drain electrodes, wherein the gate electrode includes a gate channel portion that extends through the surface passivation to contact the upper surface of the semiconductor substrate, a first gate field plate with a first horizontal bottom extent that overlies and contacts the upper surface of the surface passivation, and a second gate field plate with a second horizontal bottom extent that is higher than the first horizontal bottom extent; and forming a conductive field plate over the upper surface of the semiconductor substrate between the gate electrode and the drain electrode, wherein the conductive field plate includes a first field plate with a third horizontal bottom extent that is recessed below the upper surface of the surface passivation, and a second field plate with a fourth horizontal bottom extent that is higher than the first horizontal bottom extent of the first gate field plate.

16. The method of claim 15, wherein: forming the surface passivation includes forming a lower surface passivation sub-layer on the upper surface of the semiconductor substrate, forming an intermediate surface passivation sub-layer on the lower surface passivation sub-layer, and forming an upper surface passivation sub-layer on the intermediate surface passivation sub-layer, wherein an upper surface of the upper surface passivation sub-layer defines an upper surface of the surface passivation.

17. The method of claim 16, further comprising: simultaneously forming a gate electrode opening and a field plate opening through the ILD0; forming field plate dielectric spacers in the field plate opening on sidewalls of the ILD0, wherein the field plate dielectric spacers include vertical spacer portions that contact the sidewalls of the ILD0, horizontal spacer portions that contact the upper surface of the surface passivation, and upper dielectric spacer portions that overlie and contact the vertical and horizontal spacer portions; removing the upper surface passivation sub-layer between the field plate dielectric spacers to expose a portion of an upper surface of the intermediate surface passivation sub-layer; and removing the upper dielectric spacer portions and at least part of the vertical spacer portions of the field plate dielectric spacers, and wherein forming the conductive field plate includes forming the first field plate on the portion of the upper surface of the intermediate surface passivation sub-layer between the horizontal spacer portions, and forming the second field plate on the horizontal spacer portions.

18. The method of claim 16, further comprising:

simultaneously forming a gate electrode opening and a field plate opening through the ILD0;

forming field plate dielectric spacers in the field plate opening on sidewalls of the ILD0, wherein the field plate dielectric spacers include vertical spacer portions that contact the sidewalls of the ILD0, horizontal spacer portions that contact the upper surface of the surface passivation, and upper dielectric spacer portions that overlie and contact the vertical and horizontal spacer portions;

removing the upper surface passivation sub-layer and the intermediate surface passivation sub-layer between the field plate dielectric spacers to expose a portion of an upper surface of the lower surface passivation sub-layer; and removing the upper dielectric spacer portions and at least part of the vertical spacer portions of the field plate dielectric spacers, and wherein forming the conductive field plate includes forming the first field plate on the portion of the upper surface of the lower surface passivation sub-layer between the horizontal spacer portions, and forming the second field plate on the horizontal spacer portions.

19. The method of claim 15, further comprising:

simultaneously forming a gate electrode opening and a field plate opening through the ILD0;

forming gate dielectric spacers in the gate electrode opening on sidewalls of the ILD0, wherein the gate dielectric spacers include vertical spacer portions that contact the sidewalls of the ILD0, horizontal spacer portions that contact the upper surface of the surface passivation, and upper dielectric spacer portions that overlie and contact the vertical and horizontal spacer portions;

removing the surface passivation between the gate dielectric spacers to expose a portion of the upper surface of the semiconductor substrate; and removing the gate dielectric spacers so that the gate electrode opening has a first horizontal bottom extent that exposes the portion of the upper surface of the semiconductor substrate, a second horizontal bottom extent defined by the upper surface of the surface passivation, and a third horizontal bottom extent at or below an upper surface of the ILD0, and wherein forming the gate electrode includes depositing gate metal in the gate electrode opening to form the gate channel portion in contact with the upper surface of the semiconductor substrate at the first horizontal bottom extent of the gate electrode opening, the first gate field plate in contact with the upper surface of the surface passivation at the second horizontal bottom extent of the gate electrode opening, and the second gate field plate in contact with the third horizontal bottom extent of the gate electrode opening.

20. The method of claim 15, wherein forming the conductive field plate includes:

forming the conductive field plate to further include a third field plate with a fifth horizontal bottom extent that is higher than the fourth horizontal bottom extent of the second field plate.

21. The method of claim 20, wherein forming the ILD0 comprises:

forming a lower ILD0 sub-layer on the upper surface of the surface passivation;

forming an intermediate ILD0 sub-layer on an upper surface of the lower ILD0 sub-layer; and forming an upper ILD0 sub-layer on the upper surface of the intermediate ILD0 sub-layer, wherein the fifth horizontal bottom extent of the third field plate overlies and contacts the upper surface of the lower ILD0 sub-layer, and the second horizontal bottom extent of the second gate field plate overlies an upper surface of the intermediate ILD0 sub-layer.

22. The method of claim 21, wherein forming the conductive field plate includes:

forming the conductive field plate to further include a fourth field plate with a sixth horizontal bottom extent that overlies and contacts an upper surface of the upper ILD0 sub-layer.

23. The method of claim 15, wherein:

forming the conductive field plate includes forming the first field plate and the second field plate from a field plate metal; and the method further comprises forming a source metallization that extends from the field plate metal over the gate electrode to a source contact.

* * * * *